(12) United States Patent
Quinsat et al.

(10) Patent No.: US 9,171,888 B2
(45) Date of Patent: Oct. 27, 2015

(54) MAGNETIC MEMORY DEVICE AND DRIVING METHOD FOR THE SAME

(71) Applicant: KABUSHIKI KAISHA TOSHIBA, Tokyo (JP)

(72) Inventors: Michael Arnaud Quinsat, Yokohama (JP); Tetsufumi Tanamoto, Kawasaki (JP); Shiho Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/445,331

(22) Filed: Jul. 29, 2014

(65) Prior Publication Data
US 2015/0078070 A1    Mar. 19, 2015

(30) Foreign Application Priority Data

Sep. 18, 2013   (JP) .................. 2013-193471

(51) Int. Cl.
*G11C 11/00* (2006.01)
*H01L 27/22* (2006.01)
*H01L 43/02* (2006.01)
*G11C 11/16* (2006.01)

(52) U.S. Cl.
CPC .............. *H01L 27/228* (2013.01); *H01L 43/02* (2013.01); *G11C 11/16* (2013.01); *G11C 11/161* (2013.01); *G11C 11/1675* (2013.01); *H01L 27/222* (2013.01)

(58) Field of Classification Search
CPC ........ H01L 27/22; G11C 11/14; G11C 11/16; G11C 19/0808; G11C 11/5607; G11C 11/15; G11C 19/02

USPC ............. 365/158, 80, 173, 171; 257/E21.665
See application file for complete search history.

(56) References Cited

U.S. PATENT DOCUMENTS

| 8,320,152 B2 * | 11/2012 | Cho et al. .................... 365/80 |
| 2008/0137395 A1 | 6/2008 | Hwang et al. |
| 2010/0172169 A1 | 7/2010 | Lee et al. |
| 2011/0090730 A1 | 4/2011 | Tsai et al. |
| 2011/0157955 A1 | 6/2011 | Hung et al. |

FOREIGN PATENT DOCUMENTS

| JP | 2008-251796 | 10/2008 |
| JP | 2010-161362 | 7/2010 |

* cited by examiner

*Primary Examiner* — David Lam
(74) *Attorney, Agent, or Firm* — Finnegan, Henderson, Farabow, Garrett & Dunner, L.L.P.

(57) ABSTRACT

According to one embodiment, a magnetic memory device includes a magnetic unit, a switching part, and a reading part. The magnetic unit includes a magnetic wire, and first and second magnetic parts. The magnetic wire includes magnetic domains and has one end and one other end. The first magnetic part is connected with the one end and has a first magnetization. The second magnetic part is connected with the one end, and has a second magnetization. The switching part includes first and second switches. The first switch is connected with the first magnetic part and flows a first current between the first magnetic part and the magnetic wire. The second switch is connected with the second magnetic part and flows a second current between the second magnetic part and the magnetic wire. The reading part is configured to read a magnetization of the magnetic domains.

22 Claims, 30 Drawing Sheets

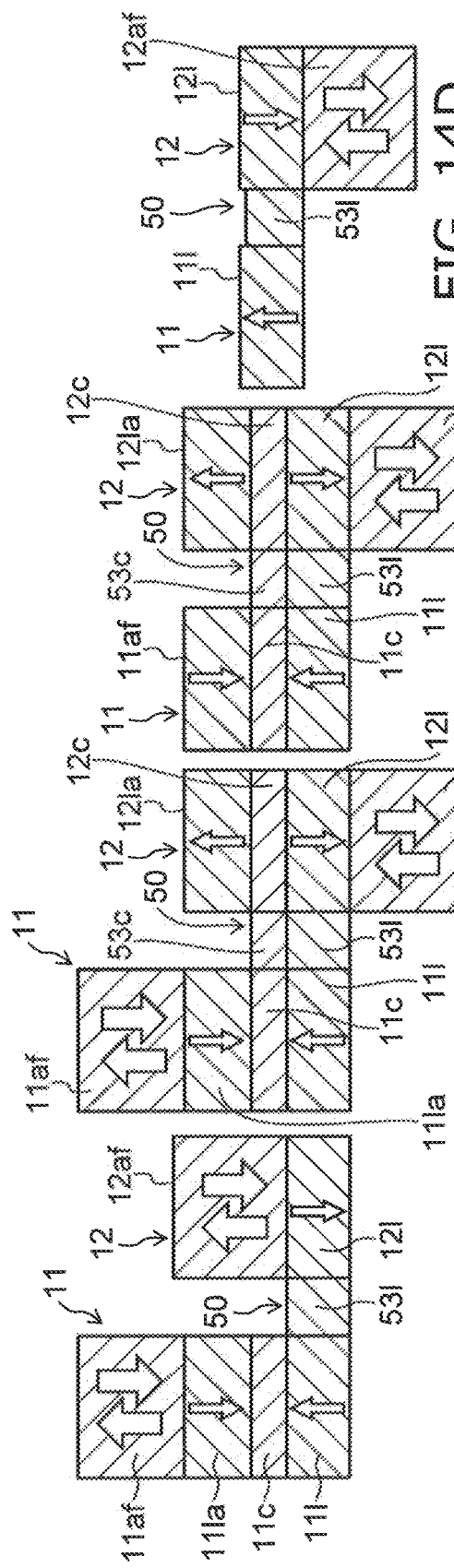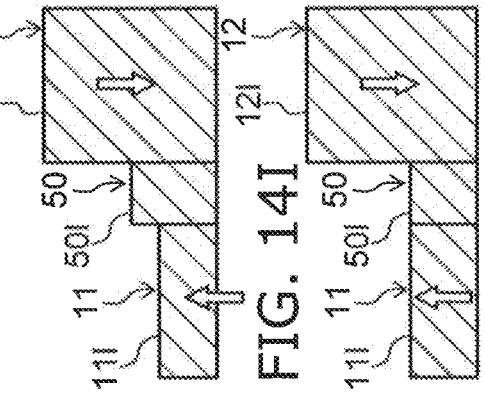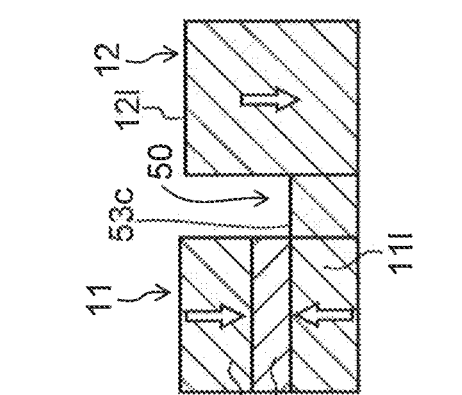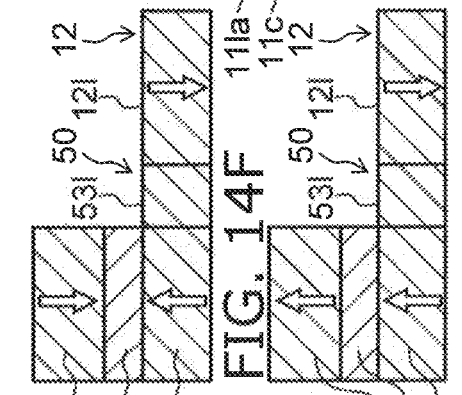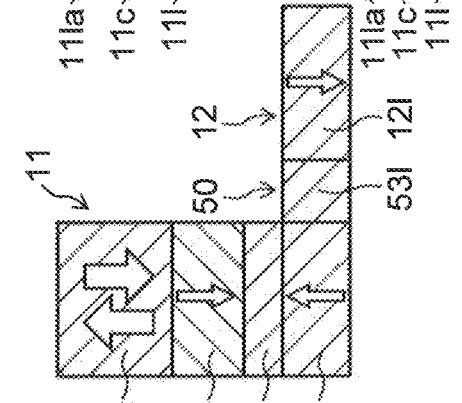

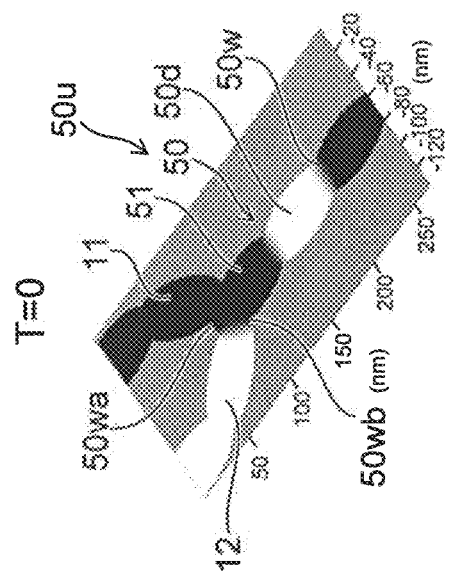
FIG. 24A T=0
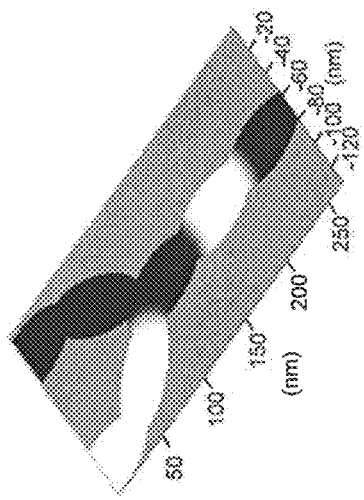
FIG. 24B T=0.1×ta
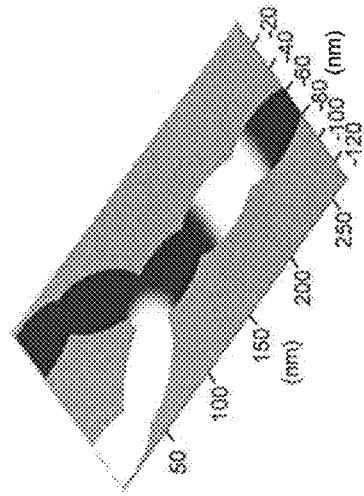
FIG. 24C T=0.25×ta
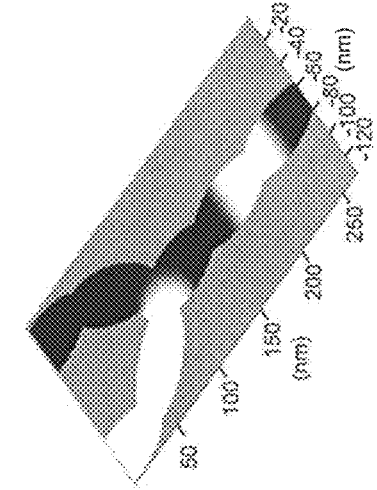
FIG. 24D T=0.4×ta
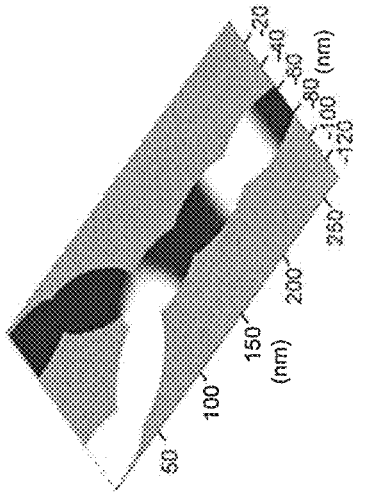
FIG. 24E T=0.6×ta
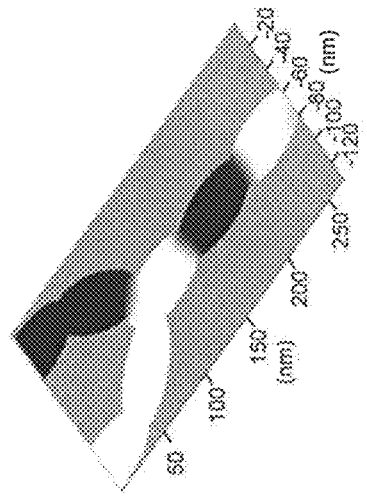
FIG. 24F T=ta

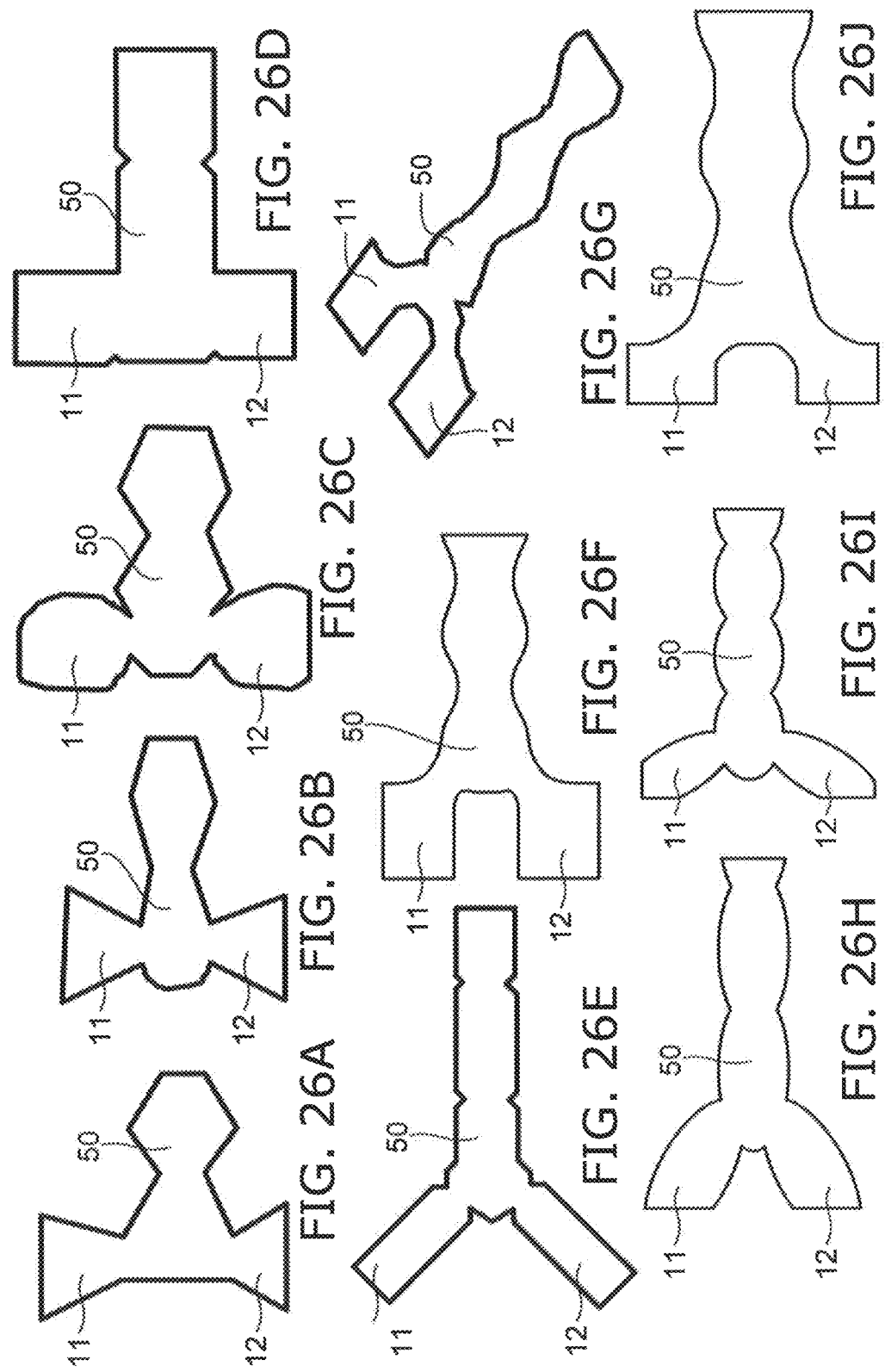

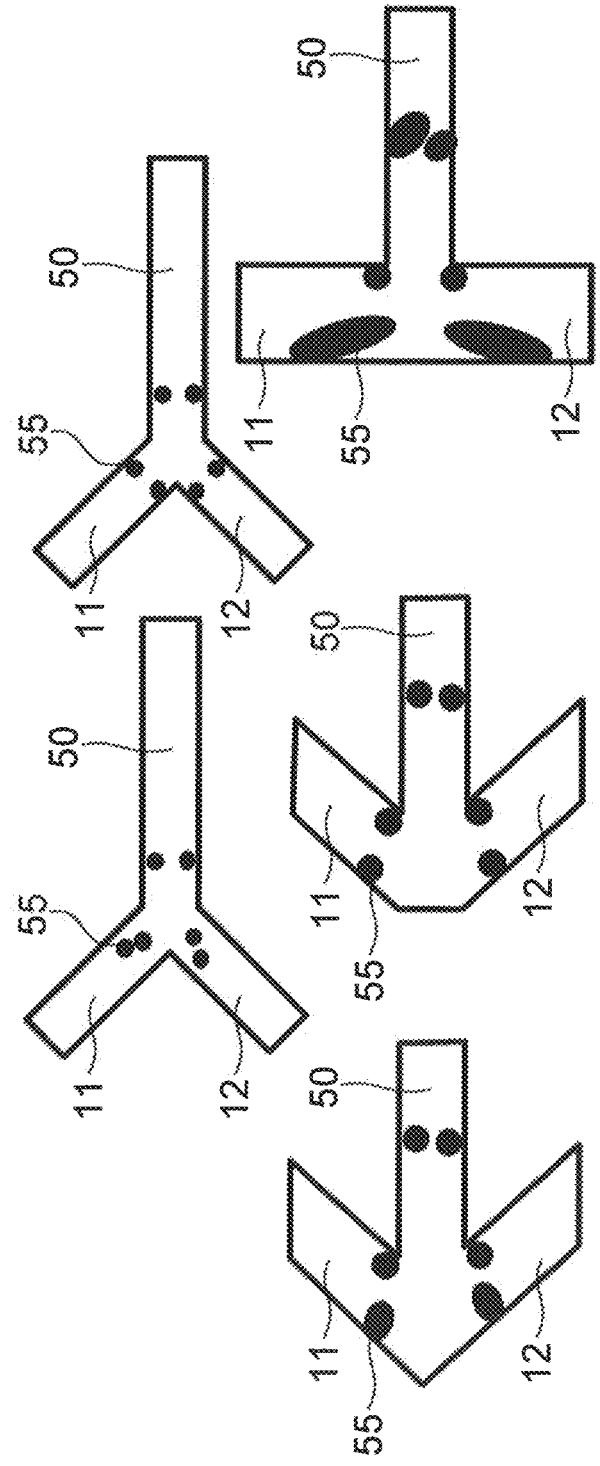

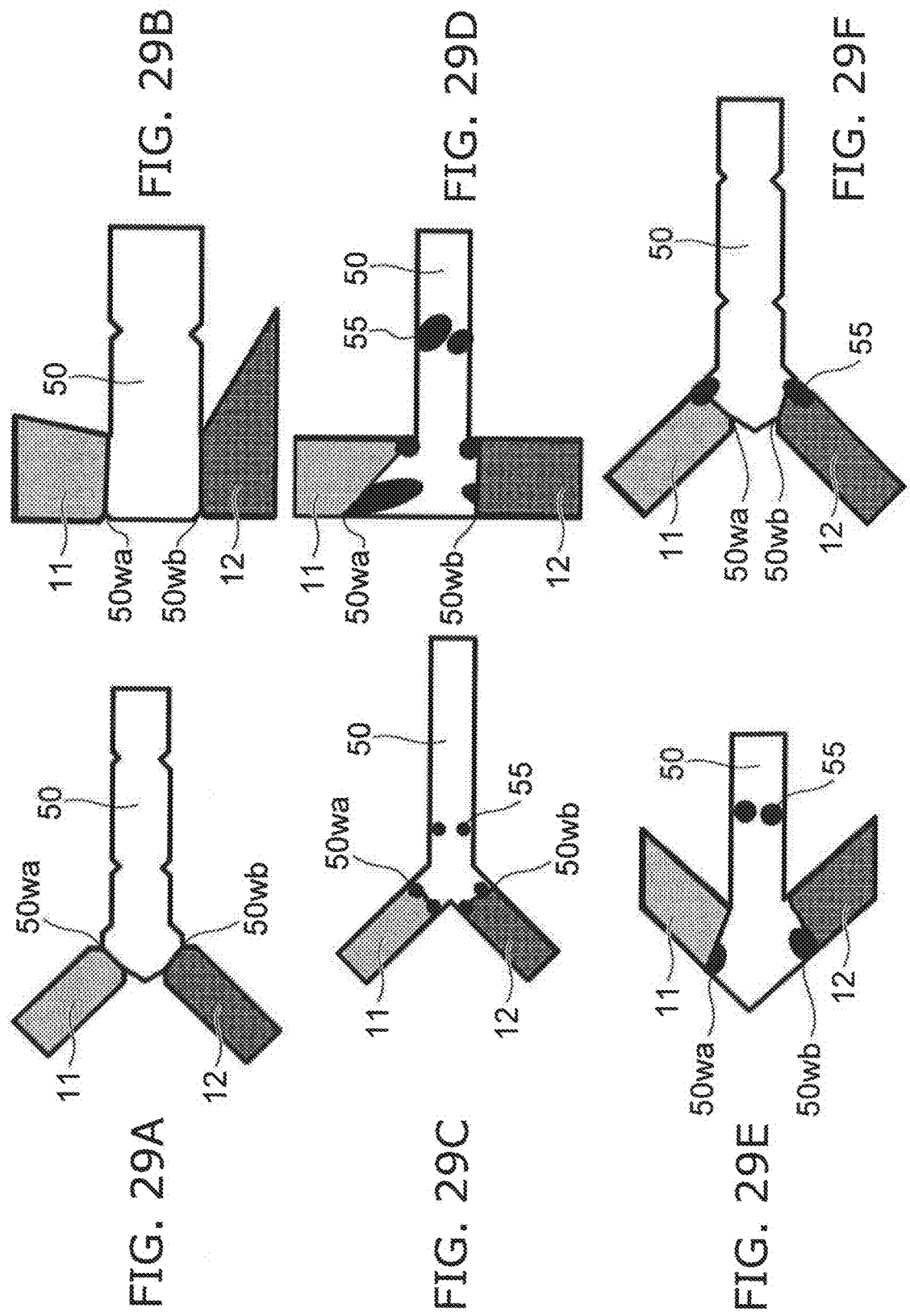

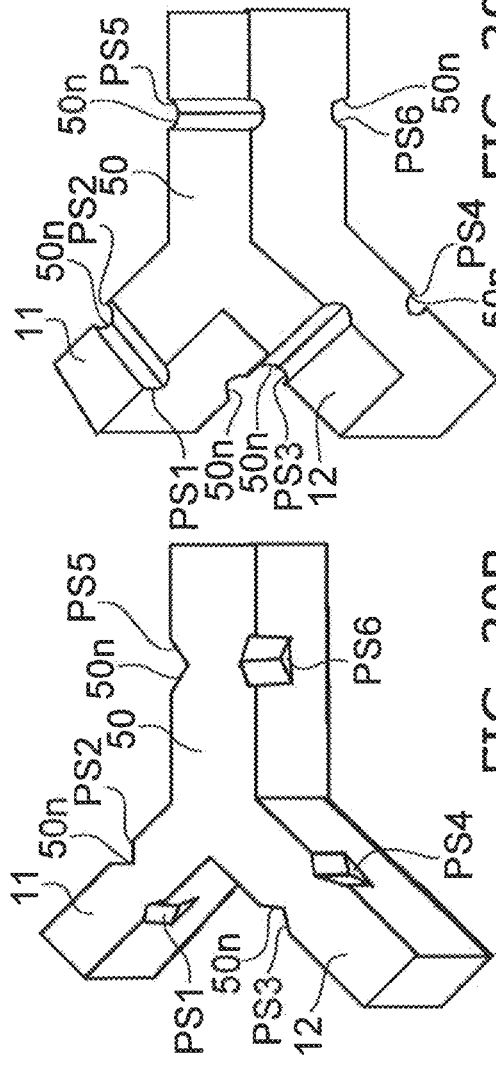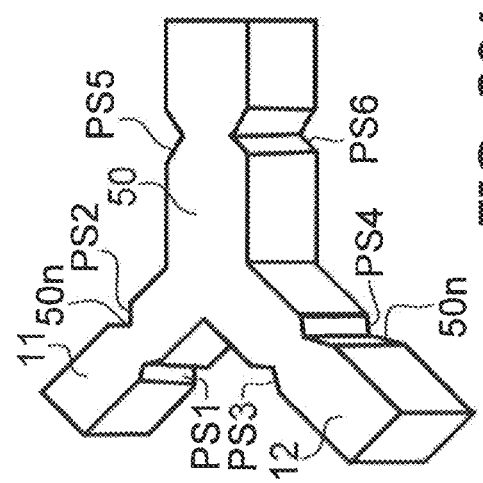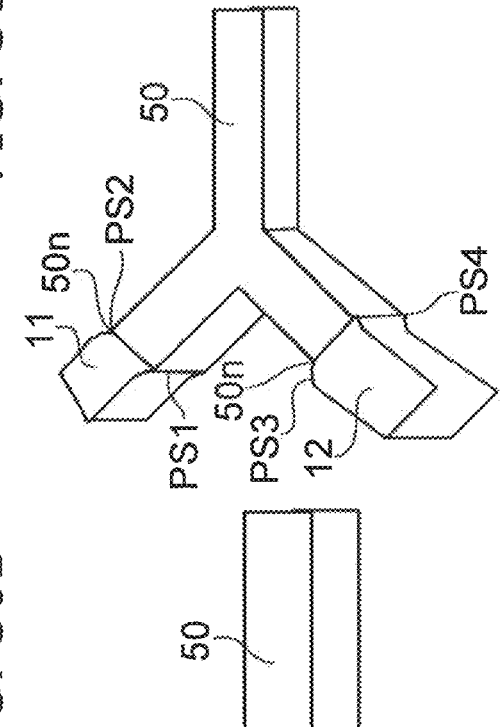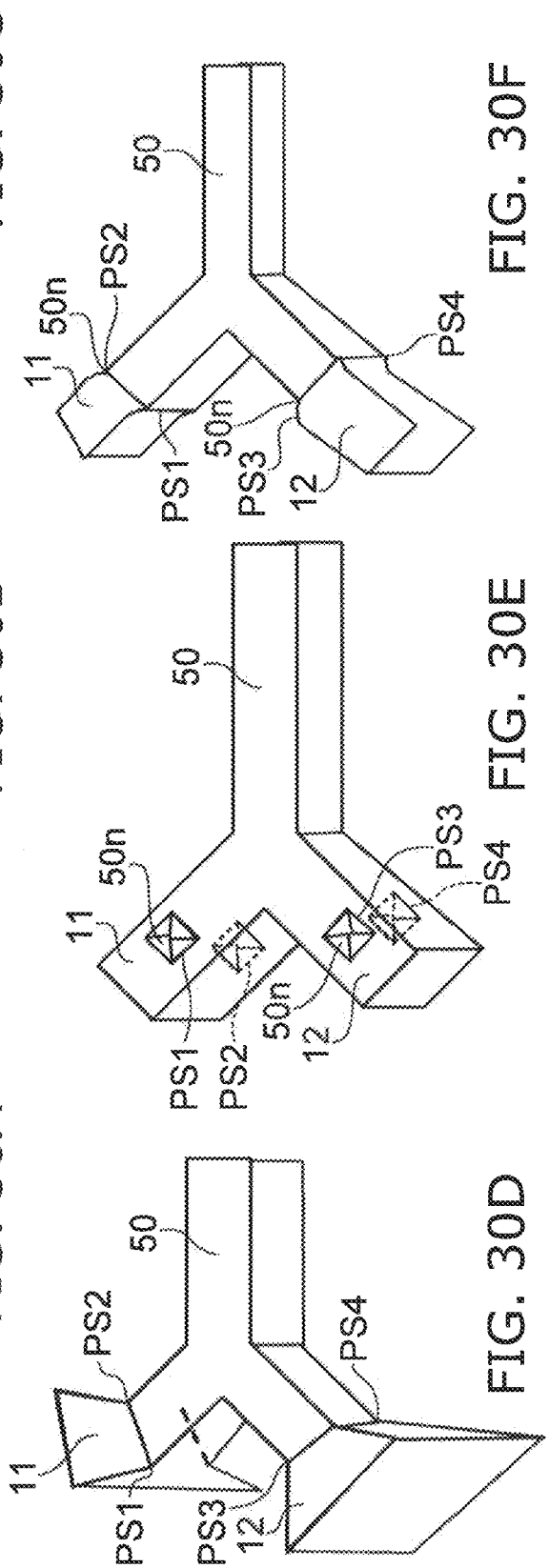

MAGNETIC MEMORY DEVICE AND DRIVING METHOD FOR THE SAME

CROSS-REFERENCE TO RELATED APPLICATIONS

This application is based upon and claims the benefit of priority from Japanese Patent Application No. 2013-193471, filed on Sep. 18, 2013; the entire contents of which are incorporated herein by reference.

FIELD

Embodiments described herein relate generally to a magnetic device and a driving method for the same.

BACKGROUND

The spin shift register type memory using magnetic domains has been proposed as a method of realizing a large scale memory. Stable operation is desired in such a magnetic memory cell.

BRIEF DESCRIPTION OF THE DRAWINGS

FIG. 14A to FIG. 14J are schematic views illustrating magnetic memory devices according to the first embodiment;

FIG. 24A to FIG. 24F are schematic views illustrating characteristics in the magnetic memory devices according to the embodiment;

FIG. 26A to FIG. 26J are schematic views illustrating the magnetic memory devices according to the embodiment;

FIG. 27A to FIG. 27E are schematic views illustrating the magnetic memory devices according to the embodiment;

FIG. 29A to FIG. 29F are schematic views illustrating the magnetic memory devices according to the embodiment; and FIG. 30A to FIG. 30F are schematic views illustrating the magnetic memory devices according to the embodiment.

DETAILED DESCRIPTION

Figure 1:
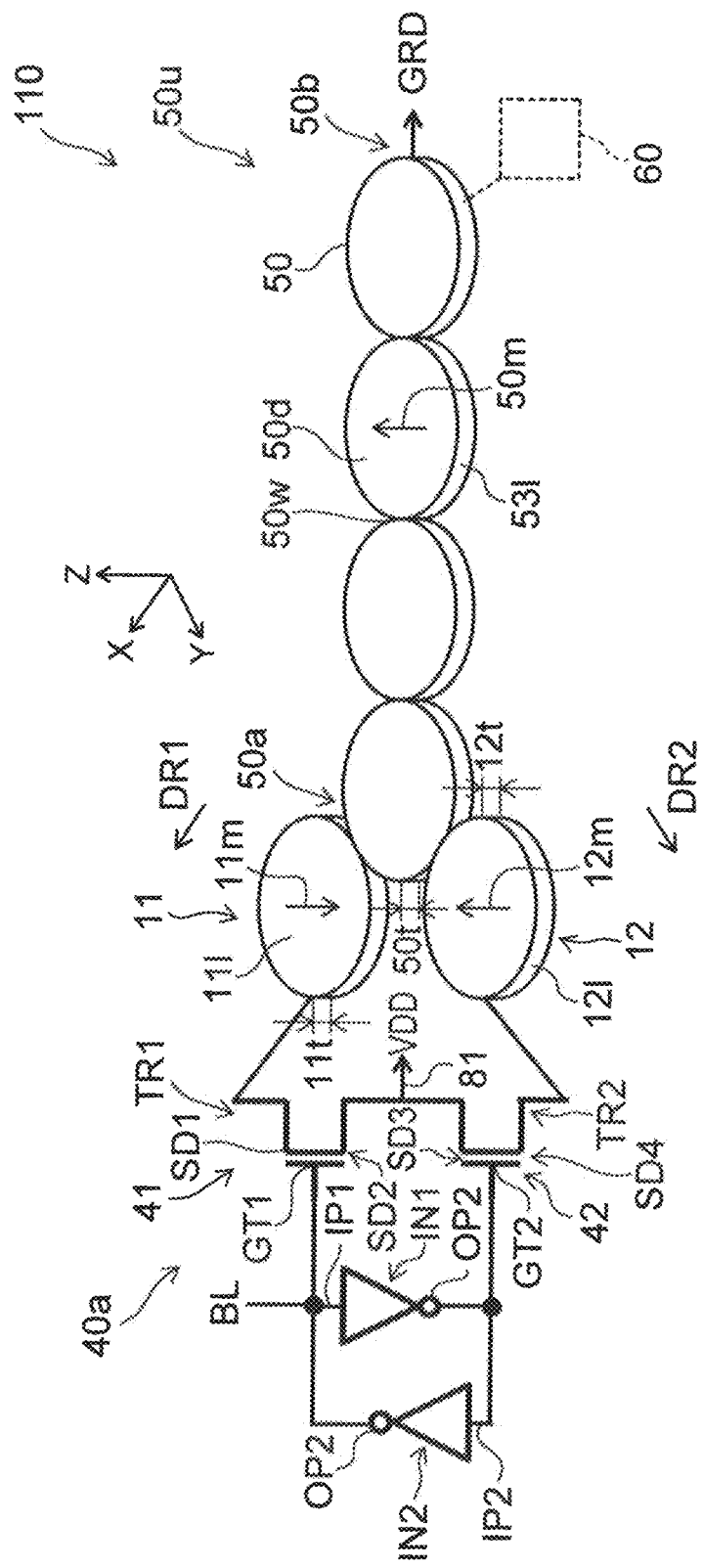
FIG. 1 is a schematic view illustrating a magnetic memory device according to the first embodiment.

According to one embodiment, a magnetic memory device includes a magnetic unit, a first switching part, and a reading part. The magnetic unit includes a first magnetic wire, a first magnetic part, and a second magnetic part. The first magnetic wire includes a plurality of magnetic domains and a magnetic wall provided between the magnetic domains. The first magnetic wire has one end and one other end. The first magnetic part is connected with the one end and has a first magnetization. The second magnetic part is connected with the one end, is apart from the first magnetic part, and has a second magnetization being opposite to the first magnetization. The first switching part includes a first switch, and a second switch. The first switch is connected with the first magnetic part and is configured to flow a first current between the first magnetic part and the first magnetic wire. The second switch is connected with the second magnetic part and is configured to flow a second current between the second magnetic part and the first magnetic wire. The reading part is configured to read a magnetization of at least one of the magnetic domains.

According to one embodiment, a driving method of a magnetic memory device is disclosed. The magnetic memory device includes a magnetic unit, a first switching part, and a second switching part. The magnetic unit includes a first magnetic wire, a first magnetic part, a second magnetic part, a third magnetic part, and a fourth magnetic part. The first magnetic wire includes a plurality of magnetic domains and a magnetic wall provided between the magnetic domains. The first magnetic wire has one end and one other end. The first magnetic part is connected with the one end and has a first magnetization. The second magnetic part is connected with the one end, is apart from the first magnetic part and has a second magnetization. The second magnetization is opposite to the first magnetization. The third magnetic part is connected with the one other end and has a third magnetization. The fourth magnetic part is connected with the one other end, is apart from the third magnetic part and has a fourth magnetization. The fourth magnetization is opposite to the third magnetization. The first switching part includes a first switch, and a second switch. The first switch is connected with the first magnetic part and is configured to flow a first current between the first magnetic part and the first magnetic wire. The second switch is connected with the second magnetic part and is configured to flow a second current between the second magnetic part and the first magnetic wire. The second switching part includes a third switch, and a fourth switch. The third switch is connected with the third magnetic part and is configured to flow a third current between the third magnetic part and the first magnetic wire. The fourth switch is connected with the fourth magnetic part and is configured to flow a fourth current between the fourth magnetic part and the first magnetic wire. The method includes setting a direction of the first current opposite to a direction of the third current, and setting a direction of the second current opposite to a direction of the fourth current.

Various embodiments will be described hereinafter with reference to the accompanying drawings.

The drawings are schematic or conceptual; and the proportions of sizes between portions and the like are not necessarily the same as the actual values thereof. The dimensions and the proportions may be illustrated differently among the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic view illustrating a magnetic memory device according to the first embodiment.

As illustrated in FIG. 1, the magnetic memory device 110 according to the embodiment includes a magnetic unit 50u, a first switch part 40a, and a reading part 60.

Magnetic unit 50u includes a magnetic wire (first magnetic wire 50), a first magnetic part 11, and a second magnetic part 12.

The first magnetic wire 50 includes a plurality of magnetic domains 50d (magnetic domain) and magnetic wall 50w. The magnetic wall 50w is provided between the plurality of magnetic domains 50d. The first magnetic wire 50 has an end (a first end 50a) and other end (a second end 50b).

For example, the first magnetic part 11 is connected with the first end 50a (the end). The first magnetic part 11 has a first magnetization 11m.

For example, the second magnetic part 12 is connected with the first end 50a. The second magnetic part 12 is apart from the first magnetic part 11. The second magnetic part 12 has the second magnetization 12m. The second magnetization 12m is opposite to the first magnetization 11m.

For example, the direction which connects the first magnetic part 11 and the first end 50a is set to be a first direction DR1. The direction which connects the second magnetic part 12 and the first end 50a is set to be a second direction DR2. The first direction DR1 and the second direction DR1 cross mutually.

A direction perpendicular to the first direction DR1 and the second direction DR2 is taken as a Z-axis direction. A direction perpendicular to the Z-axis direction is taken as an X-axis direction. A direction perpendicular to the Z-axis direction and the X-axis direction is taken as a Y-axis direction. For example, the first magnetic part 11, the second magnetic part 12 and first end 50a are arranged in the X-Y plane.

In this example, the first magnetic part 11 and the second magnetic part 12 are layer like. The first magnetic part 11 has a first thickness 11t in a direction perpendicular to the X-Y plane. The maximum value of the length (width) of the first magnetic part 11 in the X-Y plane is larger than the first thickness 11t. The second magnetic part 12 has a second thickness 12t in a direction perpendicular to the X-Y plane. The maximum value of the length (width) of the second magnetic part 12 in the X-Y plane is larger than the second thickness 12t. It is noted that the shapes of the first magnetic part 11 and the second magnetic part 12 are arbitrary in the embodiment.

In this example, the first magnetization 11m is substantially perpendicular to the X-Y plane. The second magnetization 12m is substantially perpendicular to the X-Y plane. For example, the first magnetization 11m has perpendicular anisotropy, and the second magnetization 12m has perpendicular anisotropy. For example, the component of the first magnetization 11m projected onto the Z-axis direction is larger than the component the first magnetization 11m projected onto the X-Y plane. For example, the component of the second magnetization 12m projected onto the Z-axis direction is larger than the component the second magnetization 12m projected onto the X-Y plane. The first thickness 11t of the first magnetic part 11 is not less than 0.5 nanometers (nm) and not more than 500 nm. The second thickness 12t of the second magnetic part 12 is not less than 0.5 nm and not more than 500 nm. The second thickness 12t may be different from the first thickness 11t. In the embodiment, the second thickness 12t may be same as the first thickness 11t.

Each of the magnetic domains 50d of the first magnetic wire 50 has magnetic wire magnetization 50m. The magnetic wire magnetization 50m has perpendicular anisotropy. A magnetic wire thickness 50t denotes the thickness of the first magnetic wire 50 in a direction perpendicular to the X-Y plane. The magnetic wire thickness 50t is, for example, not less than 0.5 nanometers and not more than 500 nanometers. The magnetic wire thickness 50t may be different from the first thickness 11t and different from the second thickness 12t, or may be same as them.

The first switch part 40a includes the first switch 41 and the second switch 42.

The first switch 41 is connected with the first magnetic part 11.

The first switch 41 passes the first current between the first magnetic part 11 and the first magnetic wire 50.

The second switch 42 is connected with the second magnetic part 12.

The second switch 42 passes the second current between the second magnetic part 12 and the first magnetic wire 50.

The reading part 60 is electrically connected with at least a part of first magnetic wire 50, for example. The reading part 60 detects the state of magnetization (magnetic wire magnetization 50m) in at least one of the magnetic domains 50d. The reading part 60 may be apart from the at least a part of first magnetic wire 50 as far as the reading part 60 can detect the state of magnetic wire magnetization 50m, for example. Examples of the reading part 60 are described later.

In this example, the first switch part 40a includes a first transistor TR1, a second transistor TR2, a first inverter IN1, and a second inverter IN2.

The first transistor TR1 serves as the first switch 41. The first transistor TR1 includes a first gate GT1, a first source/drain region SD1, and a second source/drain region SD2. The first source/drain region SD1 is connected with the first magnetic part 11. The second source/drain region SD2 is connected with a source of current 81. The potential of the source of current 81 is the first voltage VDD. That is, the second source/drain region SD2 is set at the first voltage VDD.

The second transistor TR2 serves as the second switch 42. The second transistor TR2 includes a second gate GT2, a third source/drain region SD3, and a fourth source/drain region SD4. The third source/drain region SD3 is connected with the second magnetic part 12. The fourth source/drain region SD4 is connected with the source of current 81. The fourth source/drain region SD4 is set at the first voltage VDD.

The first inverter IN1 includes the first inverter input IP 1 and the first inverter output OP1. The first inverter input IP 1 is connected with the first gate GT1. The first inverter output OP1 is connected with the second gate GT2.

The second inverter IN2 includes the second inverter input IP 2 and the second inverter output OP2. The second inverter input IP 2 is connected with the first inverter output OP1 and the second gate GT2. The second inverter output OP2 is connected with the first inverter input IP 1 and the first gate GT1.

The potential of second end 50b of the first magnetic wire 50 is set at the second voltage GRD. The second voltage GRD is a voltage different from the first voltage VDD. For example, the first voltage VDD is higher than the second voltage GRD. In this case, a current flows from a conductor at the first voltage VDD toward a conductor at the second voltage GRD. For example, the first voltage VDD may be lower than the second voltage GRD. In this case, a current flows from a conductor at the second voltage GRD toward a conductor at the first voltage VDD.

In order to simplify explanation, examples will be explained in which the first voltage VDD is higher than the second voltage GRD. The first voltage VDD can apply the following explanation, also when lower than the second voltage GRD.

In the magnetic memory device 110, a first operation is performed in which the first current flows in a current pass between the first magnetic part 11 and the first magnetic wire 50 through the first switch 41 (for example, the first transistor TR1). Then, a second operation is performed in which a second current flows in a pass between the second magnetic part 12 and the first magnetic wire 50 through the second switch 42 (for example, the second transistor TR2). These first operation and second operation can be changed and carried out.

For example, in the first operation, the magnetic wire magnetization 50m of the magnetic domains 50d of the first magnetic wire 50 aligns along the first magnetization 11m of the first magnetic part 11. In the second operation, the magnetic wire magnetization 50m of the magnetic domains 50d of the first magnetic wire 50 aligns along the second magnetization 12m of the second magnetic part 12. By changing and performing the first operation and the second operation, the magnetization of the first magnetic wire 50 can be set as a desired state. That is, the writing information in the magnetic memory device 110 is performed. By providing a plurality of switches, the controllability of the magnetization of the first magnetic wire 50 can be improved, and a stable operation can be realized.

That is, in the embodiment, two magnetic parts (the first magnetic part 11 and the second magnetic part 12) are connected with the first magnetic wire 50. For example, the first current can flow in a direction from the first magnetic part 11 toward the first magnetic wire 50. Alternately, the first current can flow in a direction from the first magnetic wire 50 toward the first magnetic part 11, for example. On the other hand, the second current can flow in a direction from the second magnetic part 12 toward the first magnetic wire 50, for example. Alternately, the second current can flow in a direction from the first magnetic wire 50 toward the second magnetic part 12, for example. Depending on the current, the magnetization of the magnetic domains 50d in the first magnetic wire 50 is controlled by changing the first current and the second current. That is, the writing is performed.

The first current and the second current are changed by the operation made by the first switch 41 and the second switch 42. By this structure, the writing can carry out easily. Thereby, a stable operation can be obtained.

As illustrated in FIG. 1, the direction connecting the first magnetic part 11 and the second magnetic part 12 intersects the extending direction of the first magnetic wire 50. At least a part of the end (the first end 50a) of the first magnetic wire 50 is provided between at least a part of first magnetic part 11a and at least a part of the second magnetic part 12. At least a part of the end (the first end 50a) is provided between the first magnetic part 11 and the second magnetic part 12.

The first magnetic part 11 includes a first magnetic layer 11l. The first magnetic layer 11l has, for example, a perpendicular magnetic anisotropy. The magnetization of the first magnetic layer 11l has a perpendicular anisotropy.

The second magnetic part 12 includes a second magnetic layer 2l. The second magnetic layer 12l has, for example, a perpendicular magnetization anisotropy. The magnetization of the second magnetic layer 12l has a perpendicular anisotropy.

The first magnetic wire 50 includes, for example, a magnetic wire layer 53l (a third magnetic layer). The wire magnetic layer 53l has, for example, a perpendicular magnetic anisotropy. The magnetization of the wire magnetic layer 53ls has a perpendicular anisotropy.

At least one of the first magnetic part 11, the second magnetic part 12, and the first magnetic wire 50 includes at least one selected from a group consisting cobalt (Co), iron (Fe), and nickel (Ni). At east on the first magnetic part 11, the second magnetic part 12, and the first magnetic wire 50 may include an alloy including one selected from the group recited above. At least one of the first magnetic part 11, the second magnetic part 12, and the first magnetic wire 50 may further include, for example, at least one selected from a group consisting of chromium (Cr), zirconium (Zr), copper (Cu), ruthenium (Ru), terbium (Tb), silicon (Si), germanium (Ge), gallium (Ga), magnesium (Mg), manganese (Mn), bismuth (Bi), boron (B), and antimony (Sb).

FIG. 2A to FIG. 2F are schematic cross-sectional views illustrating the magnetic memory devices according to the first embodiment.

These figures are cross-sectional views illustrating examples of a part of the magnetic memory devices 110.

Figure 2A:
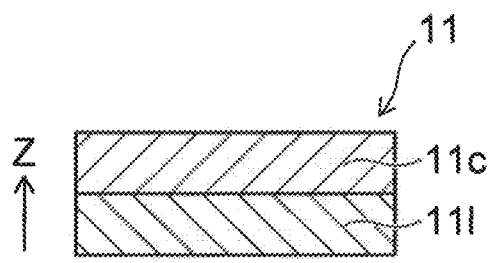
FIG. 2A to FIG. 2F are schematic cross-sectional views illustrating the magnetic memory devices according to the first embodiment.

As illustrate in FIG. 2A, the first magnetic part may include the first magnetic layer 11l and a first non-magnetic conductive layer 11c. The first non-magnetic conductive layer 11c is stacked with the first magnetic layer 11l along the Z-axis direction.

Figure 2B:
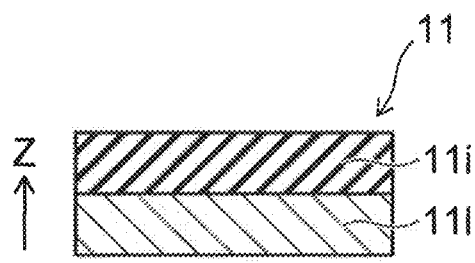

As illustrated in FIG. 2B, the first magnetic part 11 may include the first magnetic layer 11l and a non-magnetic conductive layer 11c. The first non-magnetic conductive layer 11c is stacked with the first magnetic layer 11l along the Z-axis direction.

Figure 2C:
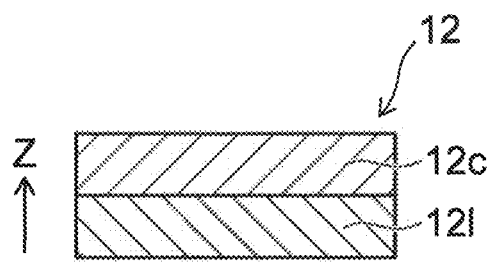

As illustrated in FIG. 2C, the second magnetic part 12 may include the second magnetic layer 21 and the second non-magnetic conductive layer 12c. The second non-magnetic conductive layer 12c is stacked with the second magnetic layer 12l along the Z-axis direction.

Figure 2D:
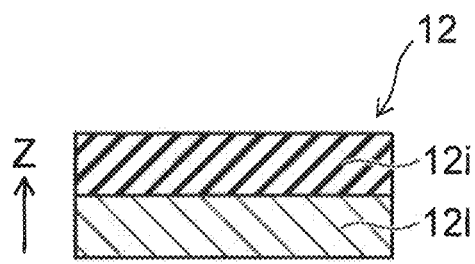

As illustrated in FIG. 2D, the second magnetic part 12 may include the second magnetic layer 12l and a second insulating layer 12i. The second insulating layer 12i is stacked with the second magnetic layer 12l along the Z-axis direction.

Figure 2E:
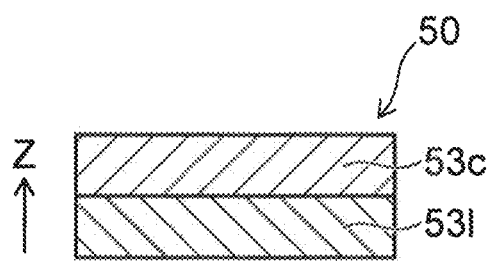

As illustrated in FIG. 2E, the first magnetic wire 50 may also include the wire magnetic layer 53l and wire non-magnetic conductive layer 53c. The wire non-magnetic conductive layer 53c is stacked with the wire magnetic layer 53l along the Z-axis direction.

Figure 2F:
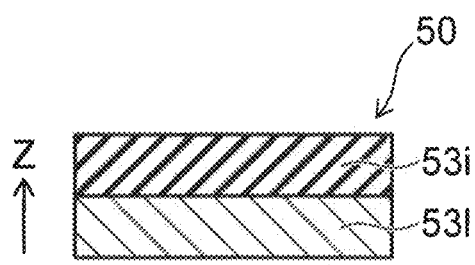

As illustrated in FIG. 2F, the first magnetic wire 50 may also include the wire magnetic layer 53l and wire insulating layer 53i. Wire insulating layer 53i is stacked with the wire magnetic layer 53l along the Z-axis direction.

For example, at least one of the first magnetic layer 11l, the second magnetic layer 12l, and the wire magnetic layer 53l may include at least one selected from a group consisting of cobalt (Co), iron (Fe), and nickel (Ni). At least one of the first magnetic layer 11l, the second magnetic layer 12l, and the wire magnetic layer 53l may include an alloy including one selected from the group. At least one of the first magnetic layer 11l, the second magnetic layer 12l and the wire magnetic layer 53 may further include at least one selected a group consisting of chromium (Cr), zirconium (Zr), copper (Cu), ruthenium (Ru), terbium (Tb), silicon (Si), germanium (Ge), gallium (Ga), magnesium (Mg), manganese (Mn), bismuth (Bi), boron (B) and antimony (Sb).

For example, at least one of the first non-magnetic conductive layer 11c and the second non-magnetic conductive layer 12c and wire non-magnetic conductive layer 53c may include at least one selected from a group consisting of platinum (Pt), tantalum (Ta), tungsten (W), zirconium (Zr), bismuth (Bi), terbium (Tb), palladium (Pd), copper (Cu), silver (Ag), iridium (Ir), gold (Au), aluminum (Al), ruthenium (Ru).

For example, at least one of the first insulating layer 11i, the second insulating layer 12i and wire insulating layer 53i includes at least one of an oxide including at least one selected from the group consisting of aluminum (Al), titanium (Ti), tantalum (Ta), cobalt (Co), nickel (Ni), silicon (Si), magnesium (Mg) and iron (Fe), a nitride including at least one selected from the group consisting of aluminum (Al), titanium (Ti), tantalum (Ta), cobalt (Co), nickel (Ni), silicon (Si), magnesium (Mg) and iron (Fe) and fluoride including at least one selected from the group consisting of aluminum (Al), titanium (Ti), tantalum (Ta), cobalt (Co), nickel (Ni), silicon (Si), magnesium (Mg) and iron (Fe).

Figure 3:
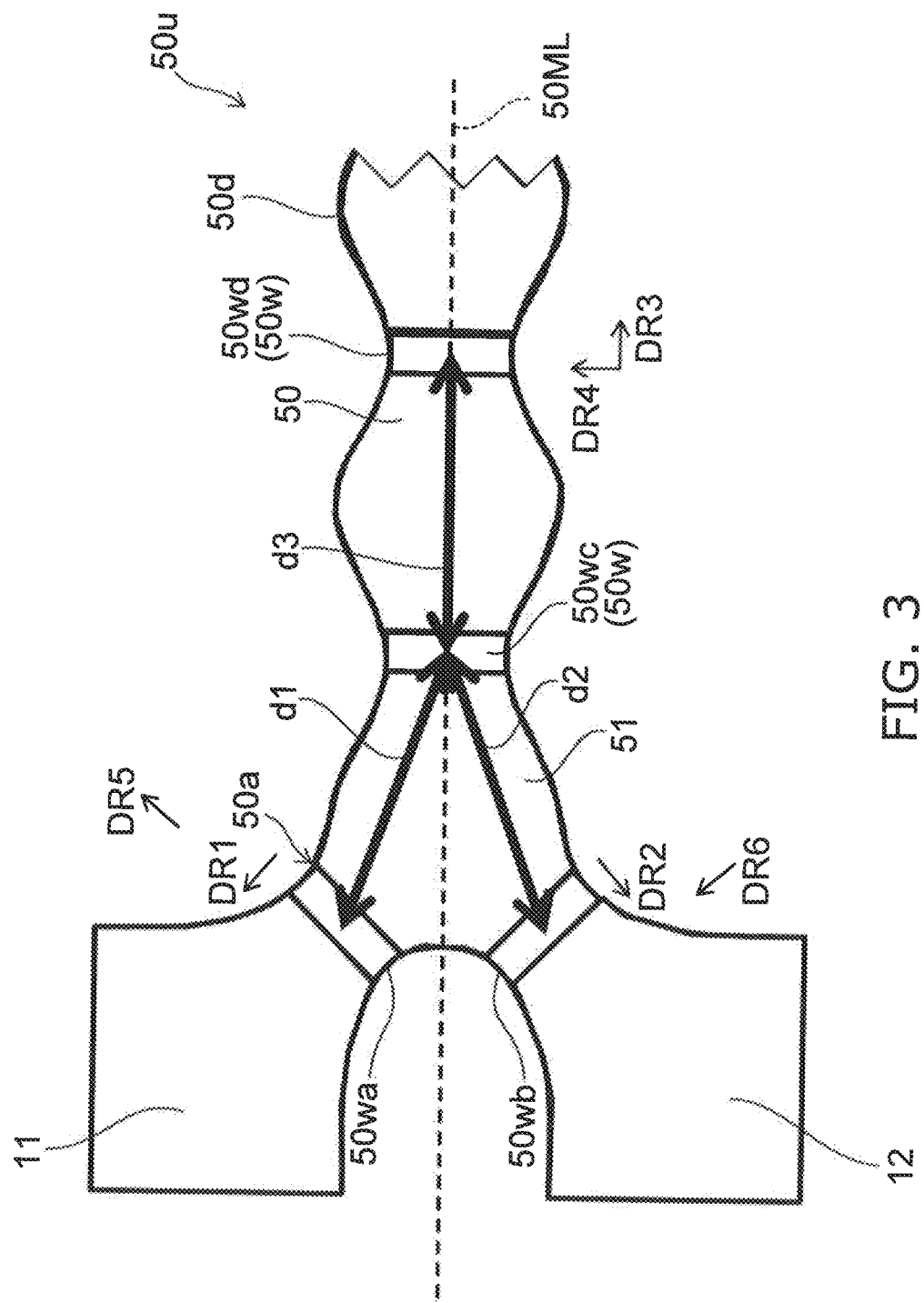
FIG. 3 is a schematic view illustrating the magnetic memory device according to the first embodiment.

FIG. 3 is a schematic view illustrating the magnetic memory device according to the first embodiment.

As illustrated in FIG. 3, in the first magnetic wire 50, the plurality of magnetic domains 50d are provided. The magnetic wall 50w is provided between the plurality of magnetic domains 50d. One magnetic domain 50d is provided between a magnetic wail 50wc and other magnetic wall 50wd. The magnetic wall 50wc and the magnetic wall 50wd are disposed so as to be adjacent to each other.

The direction (the third direction DR3) in which the first magnetic wire 50 extends intersects the first direction DR1 and intersects the second direction DR2.

For example, a length (width) of the magnetic wall 50wc along a direction (a fourth direction DR4) perpendicular to the third direction DR3 is shorter than the magnetic domains 50d length (width) along the fourth direction DR4.

The first connection part 51 is provided at the end (the first end 50a) of the first magnetic wire 50. The first connection part 51 is connected with the first magnetic part 11 and the second magnetic part 12. For example, a first connection part magnetic wall 50wa (a first boundary) is provided between the first connection part 51 and the first magnetic part 11. A second connection part magnetic wall 50wb (a second boundary) is provided between the first connection part 51 and the second magnetic part 12. Thus, the magnetic unit 50u may include a first magnetic wall provided at the first boundary or near the first boundary, and a second magnetic wall provided at the second boundary or near the second boundary part.

For example, a length (width) of the first connection part magnetic wall 50wa along a fifth direction DR5 perpendicular to the first direction DR1 is shorter than a length (width) of the first connection part 51 along the fifth direction DR5. For example, the length (width) of the first connection part magnetic wall 50wa along the fifth direction DR5 is shorter than a length (width) of the first magnetic part 11 along the fifth direction DR5. For example, a first boundary part (for example, the first connection part magnetic wall 50wa) provided between the first magnetic part 11 and the first magnetic wire 50 is narrower than the first magnetic part 11 and narrower than the magnetic domain 50d of the first magnetic wire 50.

For example, a length (width) of the second connection part magnetic wall 50wb along a sixth direction DR6 perpendicular to the second direction DR2 is shorter than a length (width) of the first connection part 51 along the sixth direction DR6. For example, the length (width) of the second connection part magnetic wall 50wb along the sixth direction DR6 is shorter than a length (width) of the first magnetic part 11 along the sixth direction DR6. For example, a second boundary part (for example, the second connection part magnetic wall 50wb) provided between the second magnetic part 12 and the first magnetic wire 50 is narrower than the second magnetic part 12 and narrower than the magnetic domain 50d of the first magnetic wire 50.

For example, a distance d1 between the first connection part magnetic wall 50wa and the magnetic wall 50wc is not less than a tenth and not more than 3 times of a distance d3 between the magnetic wall 50wc and the magnetic wall 50wd.

For example, a distance d2 between the second connection part magnetic wall 50wb and the magnetic wall 50wc is not less than a tenth and not more than 3 times of the distance d3 between the magnetic wall 50wc and the magnetic wall 50wd.

The first magnetic part 11 is disposed at a position symmetric with the second magnetic part 12 with respect to a median line 50ML of the first magnetic wire 50. The median line 50ML is a median line of the first magnetic wire 50 being along the direction (the third direction DR3) in which the first magnetic wire 50 extends.

In the embodiment, periodic pinning potential is provided in the first magnetic wire 50. The periodic pinning potential is provided along the direction (the third direction DR3) in which the first magnetic wire 50 extends.

For example, periodic shape anisotropy is provided in the first magnetic wire 50. Thereby, the periodic pinning potential is provided. Regions in which characteristics differ periodically may be provided in the first magnetic wire 50. For example, doping is periodically performed on the first magnetic wire 50. Thereby, the periodic pinning potential is provided. At least one of gallium and helium is used for the doping.

A plurality of notches (depressions) may be provided in the first magnetic wire 50. A plurality of dips (protrusions) may be provided in the first magnetic wire 50. Thereby, the periodic pinning potential is provided.

For example, a pinning potential (a first pinning potential) is provided in the domain connected with the first magnetic part 11 of the first magnetic wires 50. That is, the first pinning potential is provided in the first boundary part provided between the first magnetic part 11 and the first magnetic wire 50. A pinning potential (a second pinning potential) is provided in the domain connected with the second magnetic part 12 of the first magnetic wires 50. That is, the second pinning potential is provided in the second boundary part provided between the second magnetic part 12 and the first magnetic wire 50. These pinning potentials localize the magnetic wall 50w. These pinning potentials determine the preferred position of the magnetic wall 50w.

The first pinning potential pins the first connection part magnetic wall 50wa. The second pinning potential pins the second connection part magnetic wall 50wb. Thus, the first magnetic wire 50 has the first pinning potential and the second pinning potential to pin the magnetic wall 50w. The first pinning potential is provided near the first magnetic part 11. The second pinning potential is provided near the second magnetic part 12.

By providing the pinning potential, the magnetic domains 50d can be stably divided by the magnetic wall 50w. Thereby, a stable retention of information stored in the magnetic domains 50d can be obtained.

In the embodiment, size of the magnetic domains 50d is not less than 5 nanometers (nm) and not more than 1000 nm. The size may be not less than 10 nm and not more than 200 nm.

The size of the magnetic domains 50d can be decided corresponding to the pulse duration of the current (current pulse) supplied to the first magnetic wire 50. For example, the movement velocity of the magnetic wall 50w is about 200 m/s.

Figure 4:
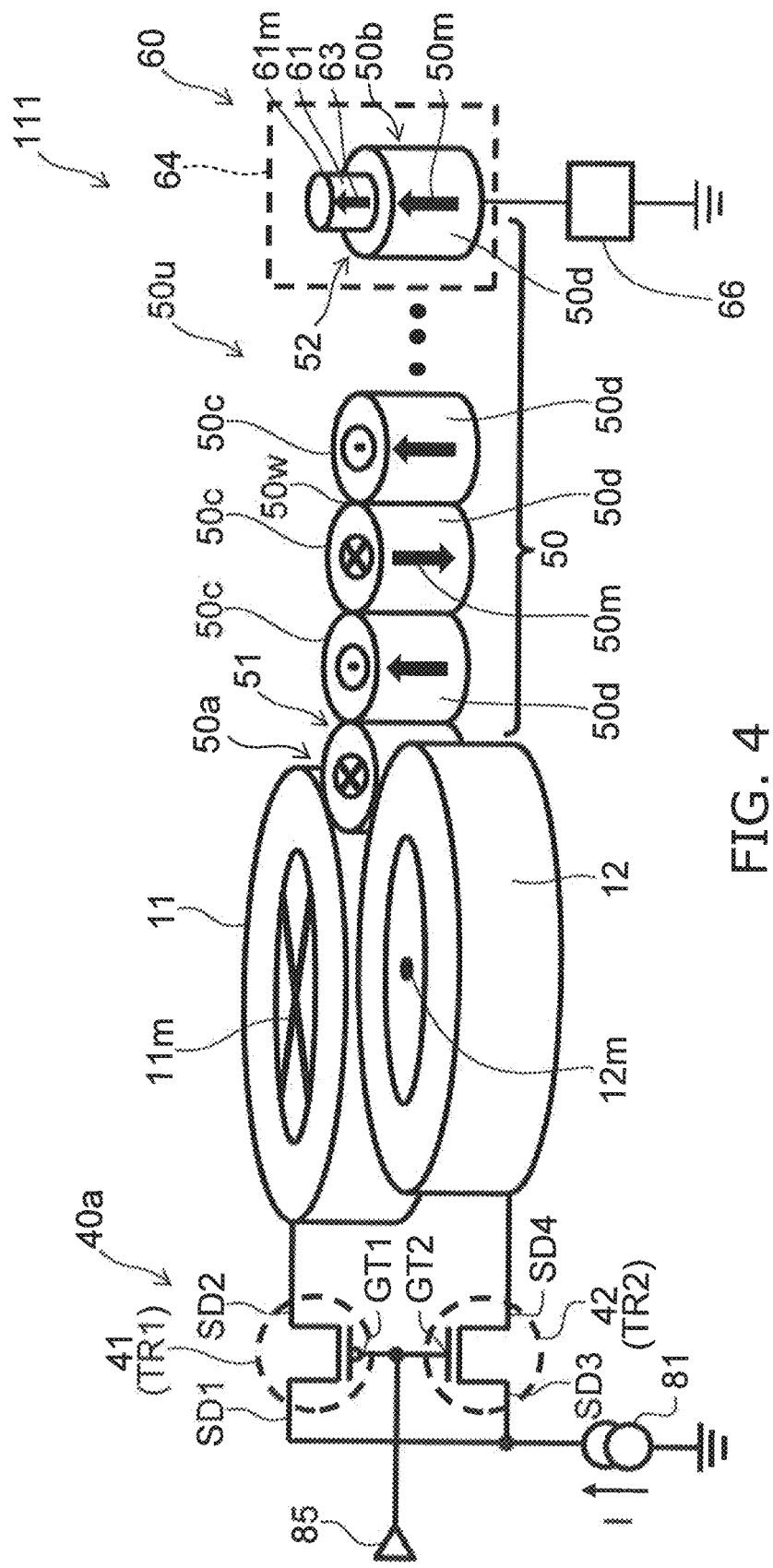
FIG. 4 is a schematic view illustrating a magnetic memory device according to the first embodiment.

FIG. 4 is a schematic view illustrating a magnetic memory device according to the first embodiment.

As illustrated in FIG. 4, also in the magnetic memory device 111 according to the embodiment, the magnetic unit 50u, the first switch part 40a, and the reading part 60 are provided.

In first switch part 40a, the first transistor TR1 of p-type MOSFET and the second transistor TR2 of n-type MOSFET are provided.

The first transistor TR1 includes a first gate GT1, a first source/drain region SD1, and a second source/drain region SD2. The first gate GT1 is connected with the data input terminal 85. The first source/drain region SD1 is connected with the source of current 81. The second source/drain region SD2 is connected with the first magnetic part 11.

The second transistor TR2 includes a second gate GT2, a third source/drain region SD3, and a fourth source/drain region SD4. The second gate GT2 is connected with the data input terminal 85. The third source/drain region SD3 is connected with the source of current 81. The fourth source/drain region SD4 is connected with the second magnetic part 12.

The first magnetic part 11 and the second magnetic part 12 are connected with the first end 50a of the first magnetic wire 50. Each of the plurality of magnetic domains 50d of the first magnetic wire 50 corresponds to each of the plurality of magnetic cells 50c.

In this example, the reading part 60 is connected with the second end 50b of the first magnetic wire 50. The reading part 60 includes a reading part magnetic layer 61. The reading part magnetic layer 61 is stacked with one of the plurality of magnetic domains 50d of the first magnetic wires 50.

In this example, the second connection part 52 of second end 50b is provided in the first magnetic wire 50. The second connection part 52 is one of the plurality of magnetic domains 50d provided at the second end 50b. In this example, the reading part magnetic layer 61 is stacked with the second connection part 52.

The reading part 60 may further include the intermediate layer 62. The intermediate layer 62 is disposed between the reading part magnetic layer 61 and the magnetic domains 50d (in this example, the second connection part 52). The intermediate layer 62 may be insulative or conductive.

The control part 66 is connected with the reading part 60. The control part 66 controls operation of the reading part 60.

In the reading part 60, resistance of the current which flows between the reading part magnetic layer 61 and the first magnetic wires 50 changes with the angles between the magnetization 61m of the reading part magnetic layer 61 and the magnetization (the magnetic wire magnetization 50m) of the magnetic domains 50d (in this example, the second connection part 52) of the first magnetic wire 50, for example. The change of the resistance is detected in the control part 66. For example, the reading part magnetic layer 61 and magnetic domains 50d (in this example, the second connection part 52) form a detection element 64. By detecting the resistance change in the detection element 64, the state of the magnetic domains 50d of the first magnetic wire 50 is detected.

For example, the magnetization (the magnetic wire magnetization 50m) in each of the plurality of the magnetic domains 50d in the first magnetic wire 50 shifts to be transported along the direction in which the first magnetic wire 50 extends by the operation of the first transistor TR1 and the second transistor TR2. The transported magnetization is read in the reading part 60. That is, the memory device of a shift register type is provided.

Figures 5A, 5B:
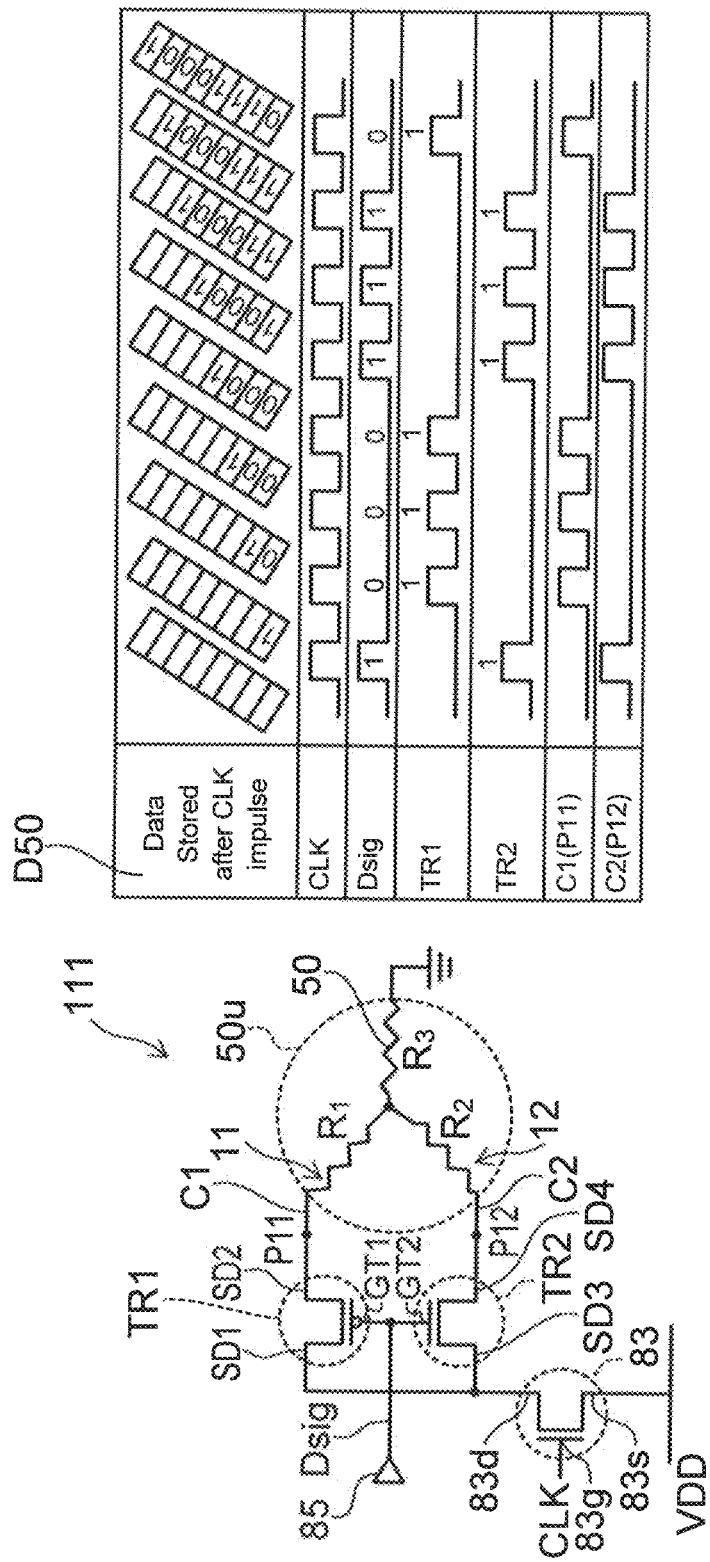
FIG. 5A and FIG. 5B are schematic views illustrating the magnetic memory device according to the first embodiment.

FIG. 5A and FIG. 5B are schematic views illustrating the magnetic memory device according to the first embodiment.

FIG. 5A illustrates the magnetic memory device 111 schematically. FIG. 5B is a timing chart which illustrates the operation in the magnetic memory device 111.

As illustrated in FIG. 5A, the source transistor 83 is provided. One terminal (source 83s) of the source transistor 83 is set at the first voltage VDD. Another terminal (drain 83d) of the source transistor 83 is connected with the first source/drain region SD1 of the first transistor TR1 and the third source/drain region SD3 of the second transistor TR1. The clock signal CLK is supplied into the gate 83g of the source transistor 83.

In FIG. 5A, the first magnetic part 11 is represented as the first resistance R1. The second magnetic part 12 is represented as the second resistance R2. The first magnetic wire 50 is represented as the third resistance R3. A first position P11 denotes the position between the first transistor TR1 and the first magnetic part 11. A second position P12 denotes the position between the second transistor TR2 and the second magnetic part 12.

The first current c1 flows at the first position P11. The second current c2 flows at the second position P12. Data signal Dsig is supplied into the data input terminal 85.

In FIG. 5B, the clock signal CLK, data signal Dsig, the state of the first transistor TR1, the state of the second transistor TR2, the first current c1, and the second current c2 are shown. The data D50 stored in the first magnetic wire 50 after the clock signal CLK (dock pulse) is supplied is further shown in FIG. 5B.

As illustrated in FIG. 5B, the data signal Dsig is supplied interlocked with the dock signal CLK. The data signal Dsig has, for example, "1" state and "0" state. Depending on the state of data signal Dsig, the state of the first transistor TR1 and the state of the second transistor TR2 change. The first current c1 and the second current c2 flow with the change of the state of the transistors. In this example, when the first current c1 flows, the second current c2 does not flow. When the second current c2 flows, the first current c1 does not flow.

The data D50 in the first magnetic wire 50 sequentially changes with such the first current c1 and the second current c2. That is, the data signal Dsig is supplied to the first magnetic wire 50 in accordance with the clock signal CLK.

In this example, the data signal Dsig of "1001110" is stored in the data D50 in the first magnetic wire 50. Thus, the writing of data is performed on the first magnetic wire 50.

In the embodiment, a first state to pass the first current c1 and, a second state to pass the second current c2 are formed by making two transistors to turn on and turn off alternately. These states are formed stably. That is, an operation of stable writing can be performed and a stabile operation can be achieved.

Figure 6:
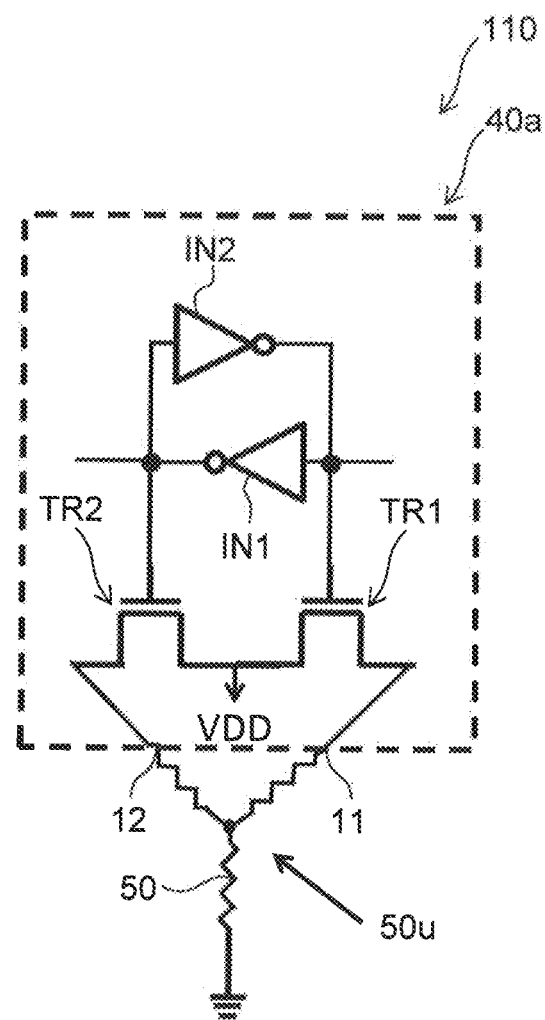
FIG. 6 is a schematic view illustrating the magnetic memory device according to the first embodiment.

FIG. 6 is a schematic view illustrating the magnetic memory device according to the first embodiment.

FIG. 6 schematically illustrates the magnetic memory device 110 illustrated in FIG. 1. Also in the magnetic memory device 110, data can be written by driving explained with respect to FIG. 5B, for example.

Figure 7:
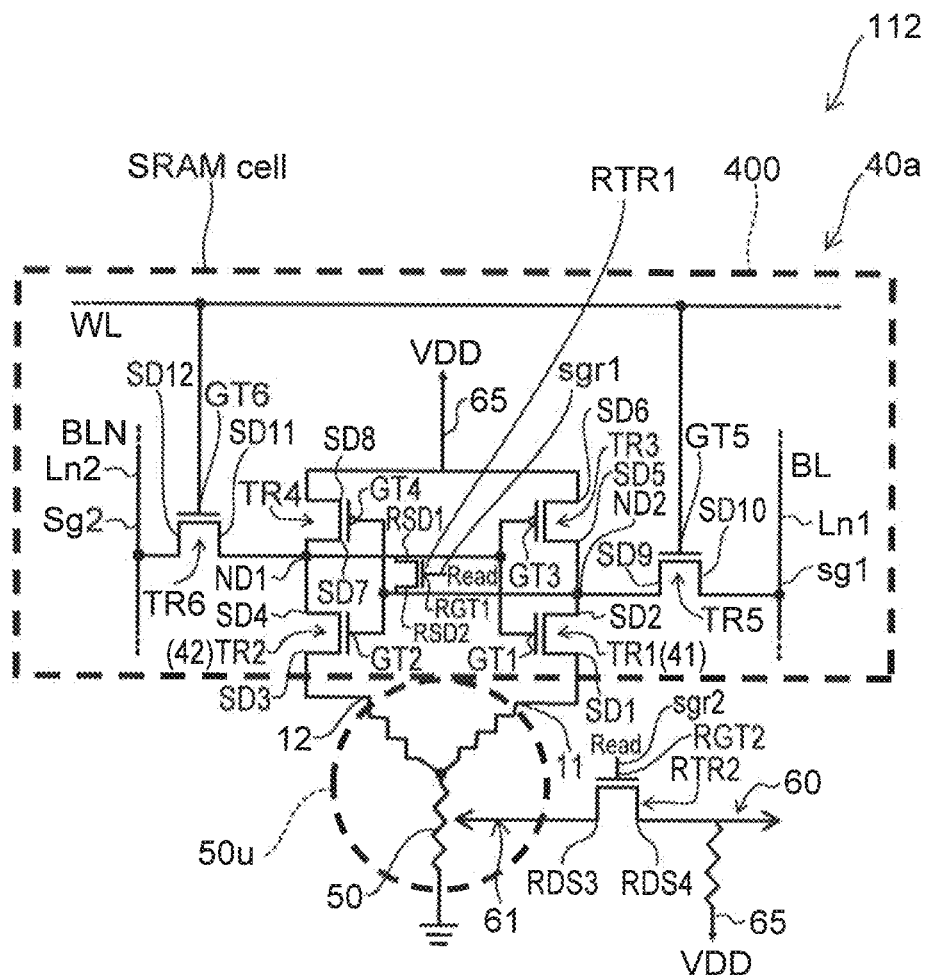
FIG. 7 is a schematic view illustrating a magnetic memory device according to the first embodiment.

FIG. 7 is a schematic view illustrating a magnetic memory device according to the first embodiment.

FIG. 7 has illustrated another magnetic memory device 112 according to the embodiment. As illustrated in FIG. 7, also in a magnetic memory device 112, the magnetic unit 50u, first switch part 40a, and the reading part 60 are provided.

In this example, an SRAM cell is provided in first switch part 40a. That is, for example, the first switch 41 (the first transistor TR1) and the second switch 42 (the second transistor TR2) form an SRAM cell.

In this example, a word line WL, a bit line BL (the first line Ln1), and a bit line bar BLN (the second line Ln2) are provided, for example. The first signal sg1 (the first data signal) is supplied to the bit line BL. the second signal sg2 (the second data signal) flows in the bit line bar BLN. The second signal sg2 is an inverse signal to the first signal sg1. That is, the signal inverse to the bit line BL is supplied to the bit line bar BLN.

In this example, six transistors are provided in the SRAM cell. That is, the first switch part 40a includes the first to the sixth transistor TR1-TR6.

The first transistor TR1 serves as the first switch 41. The first transistor TR1 includes a first gate GT1, a first source/drain region SD1, and a second source/drain region SD2. The first gate GT1 is connected with the first node ND1. The first source/drain region SD1 is connected with the first magnetic part 11. The second source/drain region SD2 is connected with the second node ND2. The first transistor TR1 is, for example, n-type MOSFET.

The second transistor TR2 serves as the second switch 42. The second transistor TR2 includes a second gate GT2, a third source/drain region SD3 and a fourth source/drain region SD4. The second gate GT2 is connected with the second node ND2. The third source/drain region SD3 is connected with the second magnetic part 12. The fourth source/drain region SD4 is connected with the first node ND1. The second transistor TR2 is, for example, n-type MOSFET.

The third transistor TR3 includes a third gate GT3, the fifth source/drain region SD5 and a sixth source/drain region SD6. The third gate GT3 is connected with the first node ND1. The fifth source/drain region SD5 is connected with the second node ND2. The sixth source/drain region SD6 is connected with a terminal 65. Predetermined voltage is supplied to the terminal 65. That is, the terminal 65 is set at the first voltage VDD. The third transistor TR3 is, for example, p-type MOSFET.

The fourth transistor TR4 includes a fourth gate GT4, a seventh source/drain region SD7 and an eighth source/drain region SD8. The fourth gate GT4 is connected with the second node ND2. The seventh source/drain region SD7 is connected with the first node ND1. The eighth source/drain region SD8 is connected with the terminal 65. The fourth transistor TR4 is, for example, p-type MOSFET.

The fifth transistor TR5 includes a fifth gate GT5, a ninth source/drain region SD9 and a tenth source/drain region SD10.

The fifth gate GT5 is connected with a word line WL. The ninth source/drain region SD9 is connected with the second node ND2. The tenth source/drain region SD10 is connected with the first line Ln1. That is, the first signal sg1 (the first data signal) is supplied to the tenth source/drain region SD10. The fifth transistor TR5 is, for example, n-type MOSFET.

The sixth transistor TR6 includes a sixth gate GT6, an eleventh source/drain region SD11 and a twelfth source/drain region SD12.

The sixth gate GT6 is connected with a word line WL. The eleventh source/drain region SD11 is connected with the first node ND1. The twelfth source/drain region SD12 is connected with the second line Ln2. That is, the second signal sg2 (the first data signal and the second data signal of reversal) is supplied to the twelfth source/drain region SD12. The sixth transistor TR6 is, for example, n-type MOSFET.

The current which flows in the first magnetic part 11 and the second magnetic part 12 can be changed and controlled by such a six transistor type SRAM cell.

In this example, the first switch part 40a further includes a reading transistor RTR1. The reading transistor RTR1 turns off or bypasses the first switch part 40a when reading the memory. The reading transistor RTR1 includes a first reading gate RGT1, a first reading source/drain region RSD1 and a second reading source/drain region RSD2.

The reading signal sgr1 (namely, "Read") is supplied into the first reading gate RGT1. The first reading source/drain region RSD1 is electrically connected with the first node ND1. The second reading source/drain region RSD2 is electrically connected with the second node ND2. In this case, it forces the first gate GT1 and the second gate GT2 to be at the same potential, and the second transistor TR2 and the first transistor TR1 are switch OFF simultaneously.

The reading part 60 further includes a sensing transistor RTR2r. In the reading part 60, for example, a sensing device (for example, the reading part magnetic layer 61) is provided. A resistance of the sensing device is changed in accordance with a change of the magnetization (the magnetic wire magnetization 50m) of the first magnetic wire 50.

The sensing transistor RTR2 includes a sensing gate RGT2, a first sensing source/drain region RSD3 and a second sensing source/drain region RSD4. The reading signal sgr1 is supplied into the sensing gate RGT2. The first sensing source/drain region RSD3 is electrically connected with the sensing device, for example. The first sensing source/drain region RSD3 is electrically connected with at least an element sensitive to the orientation of at least one magnetic domain 50d of the first magnetic wire 50. The second sensing source/drain region RSD4 is electrically connected with a terminal 65 (the first voltage VDD). For example, the first sensing source/drain region RSD3 is electrically connected with the reading part magnetic layer 61. For example, the first sensing source/rain region RSD3 is electrically connected with a device whose resistance depends upon the magnetic wire domain orientations.

For example, the operations of the first transistor TR1 and the second transistor TR2 are controlled by the reading signal sgr1. The current flowing between the first magnetic wire 50 and the reading part 60 is controlled by the reading signal sgr1. The current flowing in reading part 60 which is electrically connected with the first magnetic wire 50 is controlled by the reading signal sgr1. Thereby, the resistance of the detection element 64 is detected. Thereby, the information written in the first magnetic wire 50 is read.

Figures 8A, 8B:
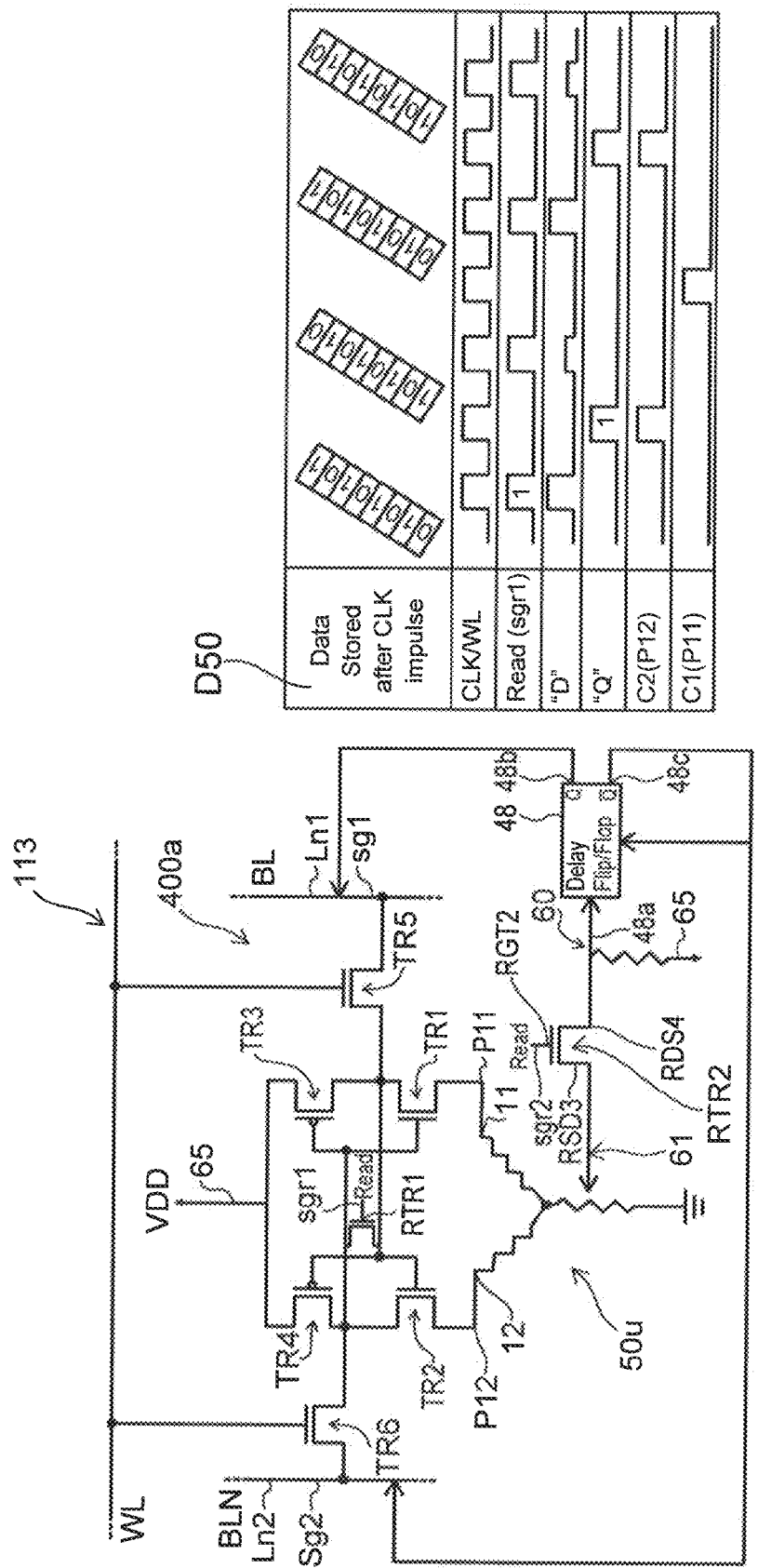
FIG. 8A and FIG. 8B are schematic views illustrating a magnetic memory device according to the first embodiment.

FIG. 8A and FIG. 8B are schematic views illustrating a magnetic memory device according to the first embodiment.

FIG. 8A schematically illustrates the magnetic memory device 113. FIG. 8B is a timing chart illustrating an operation in the magnetic memory device 113.

As illustrated in FIG. 8A, another magnetic memory device 113 according to the embodiment includes a flip-flop circuit part 48 in addition to the magnetic unit 50u, the first switch part 40a and the reading part 60. The flip-flop circuit part 48 is, for example, a flip-flop delay circuit.

The flip-flop circuit part 48 has a first flip-flop terminal 48a, a second flip-flop terminal 48b and a third flip-flop terminal 48c. The first flip-flop terminal 48a is connected with the fourth reading source/drain region RSD4 of the sensing transistor RTR2. The second flip-flop terminal 48b is connected with the first line Ln1. The first line Ln1 corresponds to the bit line BL to which the first data signal (the first signal sg1) is supplied. The third flip-flop terminal 48c is connected with the second line Ln2. The second line Ln2 corresponds to the bit line bar BLN to which the second data signal (the second signal sg2) is supplied.

The first flip-flop terminal 48a is the input of the flip-flop circuit part 48. A signal "D" is supplied into the first flip-flop terminal 48a. The second flip-flop terminal 48b is the output "Q" of the flip-flop circuit part 48. The third flip-flop terminal 48c is the output "QN" of the flip-flop circuit part 48. "QN" is "Q bar." "QN" is inverse to "Q."

In FIG. 8B, the clock signal CLK, the reading signal sgr1, "D", "Q", the first current c1 and the second current c2 are shown. The clock signal CLK may be the signal of the word line WL. The reading signal sgr1 corresponds to "Read." The data D50 stored in the first magnetic wire 50 after the clock signal CLK is supplied is further shown in FIG. 8B.

The magnetization (the magnetic wire magnetization 50m) of the magnetic domains 50d of the first magnetic wire 50 is detected by the reading part 60, and the data (information) stored in the first magnetic wire 50 is read. And the read data is delayed by the flip-flop circuit part 48. The delayed data is written in the first magnetic wire 50 again.

In this example, the read data remains, also after the reading the memorized data. That is, a non-destructive reading of the data of the shift register can be performed.

Figure 9:
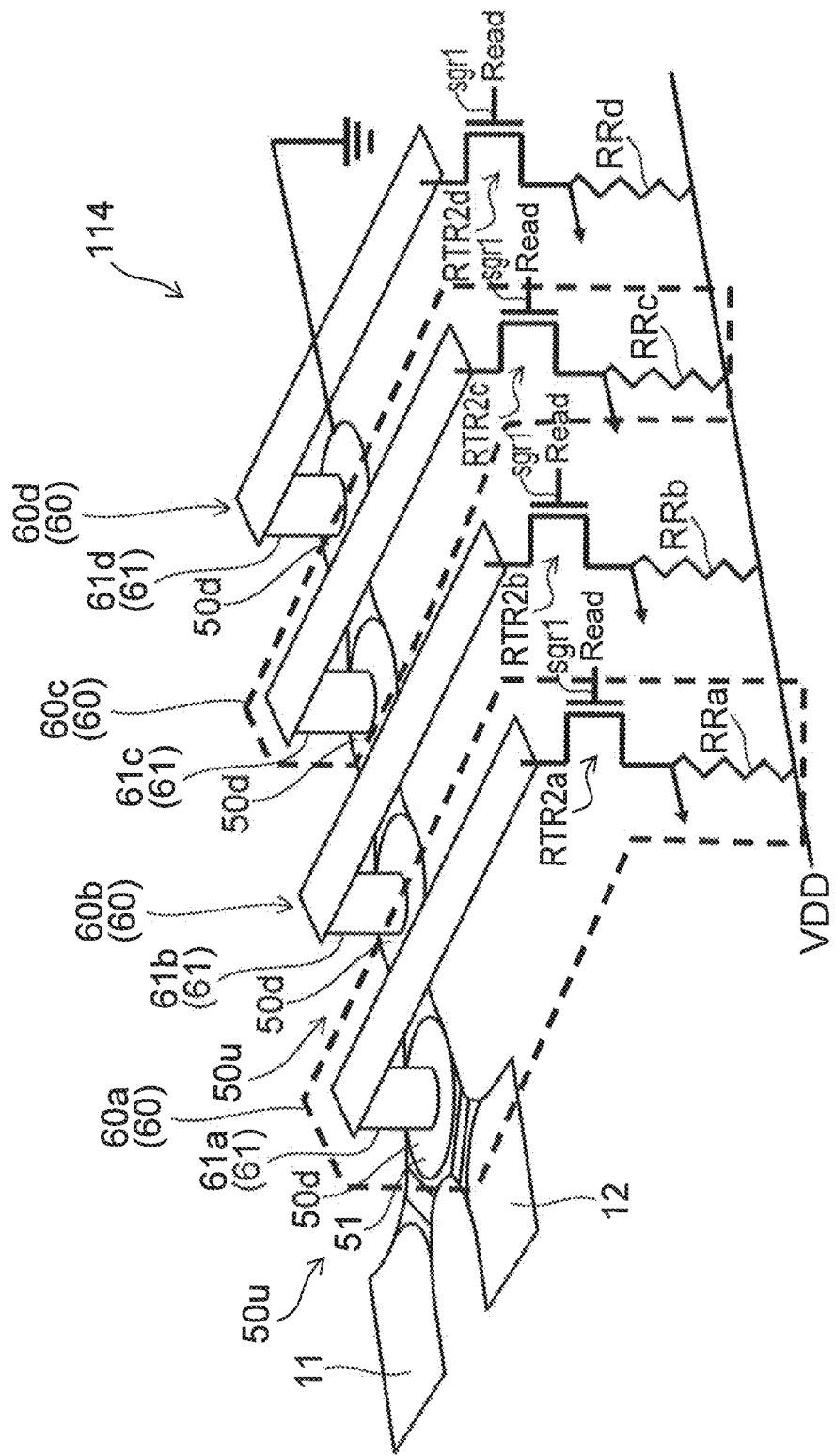
FIG. 9 is a schematic view illustrating a magnetic memory device according to the first embodiment.

FIG. 9 is a schematic view illustrating a magnetic memory device according to the first embodiment.

As illustrated in FIG. 9, in a magnetic memory device 114 according to the embodiment, a plurality of reading parts 60 (for example, the first to the fourth reading parts 60a-60d, etc.) are provided. Each of the plurality of reading parts 60 is electrically connected with one of the plurality of magnetic domains 50d of the first magnetic wires 50, for example. For example, each of the plurality of reading parts 60 is electrically connected with a device whose resistance depends upon the magnetic wire domain orientations. For example, each of the reading part magnetic layers 61 of the reading part 60 is stacked with magnetic domain 50d. Thereby, a Serial-In/Parallel-Out shift register is provided.

In this example, the first reading part 60a includes a reading part magnetic layer 61a, a sensing transistor RTR2a and a resistance RRa. The second reading part 60b includes a reading part magnetic layer 61b, a sensing transistor RTR2b and a resistance RRb. The third reading part 60c includes a reading part magnetic layer 61c, a sensing transistor RTR2c and a resistance RRc. The fourth reading part 60d includes a reading part magnetic layer 61d, a sensing transistor RTR2d and a resistance RRa.

In each of the reading parts, the sensing transistor is provided between the reading part magnetic layer 61 and resistance. The signal sgr1 (namely, "Read") is supplied to the gate of each of the sensing transistors. By the reading signal sgr1, the state of magnetization of the magnetic domains 50d is read in each of the reading parts. That is, the written information is read.

In the embodiment, the characteristics may differ in the plurality of sensing transistors. For example, the characteristic of the sensing transistor RTR2a may differ from the characteristic of the sensing transistor RTR2c. The characteristics may differ in the plurality of resistance. For example, the resistance RRa may differ from the resistance RRc.

Figure 10:
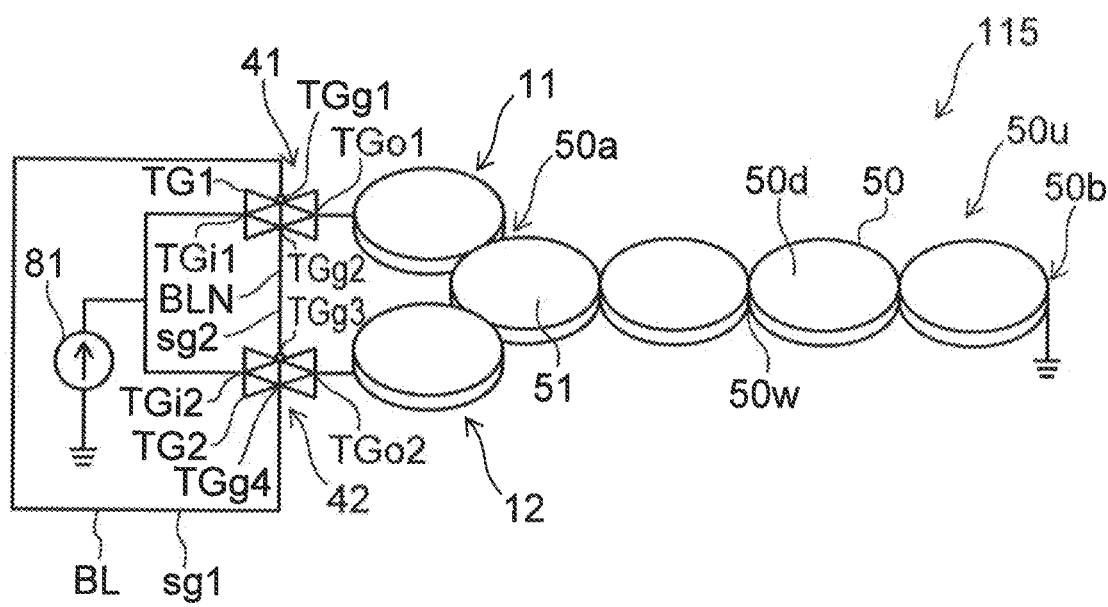
FIG. 10 is a schematic view illustrating a magnetic memory device according to the first embodiment.

FIG. 10 is a schematic view illustrating a magnetic memory device according to the first embodiment.

As illustrated in FIG. 10, also in another magnetic memory device 115 according to the embodiment, the magnetic unit 50u and the first switch part 40a are provided. The reading part 60 is omitted in FIG. 10.

In the magnetic memory device 115, the first switch part 40a includes a first transmission gate TG1 and a second transmission gate TG2.

The first transmission gate TG1 serves as the first switch 41. The first transmission gate TG1 includes a first input part TGi1, a first output part TGo1, a first gate TGg1 and a second gate TGg2. The first input part TGi1 is connected with the source of current 81. The first output part TGo1 is connected with the first magnetic part 11. The first signal sg1 (the first data signal) is supplied to the first gate TGg1. The second signal sg2 (the second data signal) is supplied to the second gate TGg2. The second data signal is a signal being reverse to the first data signal.

The second transmission gate TG2 serves as the second switch 42. The second transmission gate TG2 includes a second input part TGi2, a second output part TGo2, a third gate TGg3 and a fourth gate TGg4. The second input part TGi2 is connected with the source of current 81. The second output part TGo2 is connected with the second magnetic part 12. The second signal sg2 (the second data signal) is supplied to the third gate TGg3. The first signal sg1 (the first data signal) is supplied to the fourth gate TGg4.

Also in a magnetic memory device 115, a stable writing is obtained by using two transmission gates. According to the embodiment, the magnetic memory device in which a stable operation is possible can be provided.

Figure 11A:
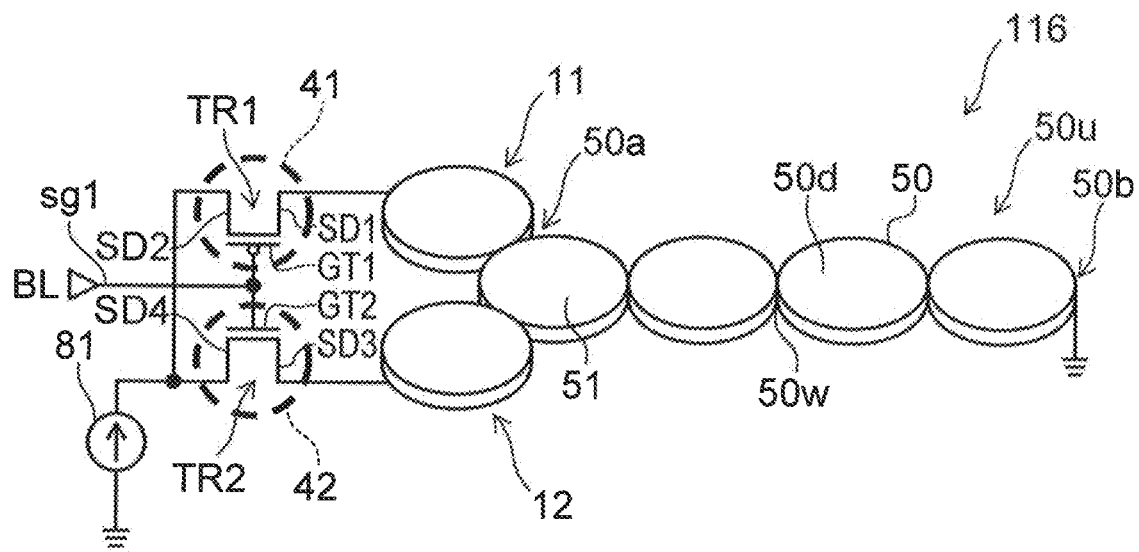
FIG. 11A and FIG. 11B are schematic views illustrating magnetic memory devices according to the first embodiment.
Figure 11B:
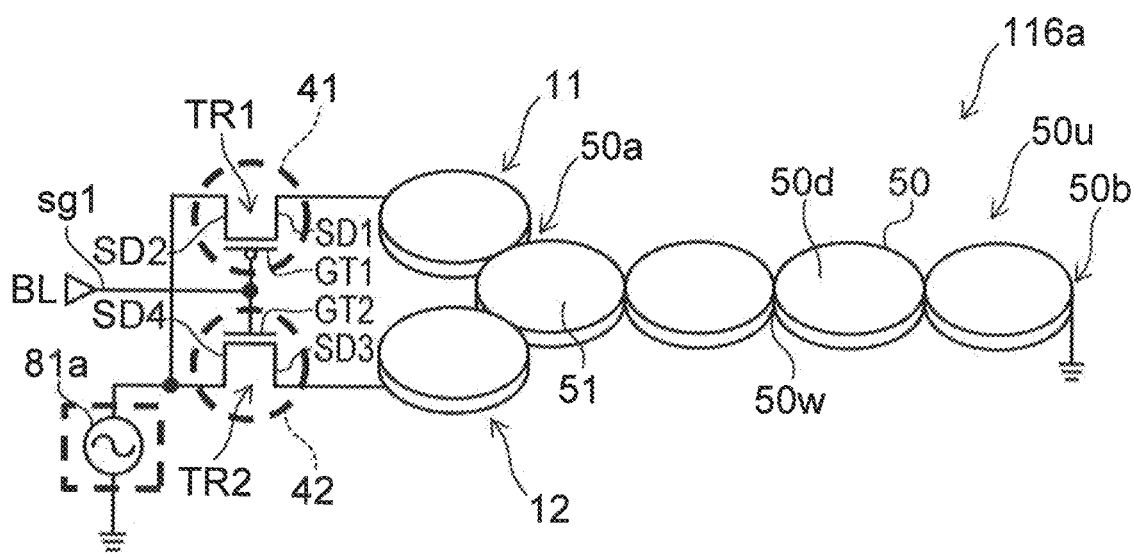

FIG. 11A and FIG. 11B are schematic views illustrating magnetic memory devices according to the first embodiment.

As illustrated in FIG. 11A, also in another magnetic memory device 116 according to the embodiment, the magnetic unit 50u and the first switch part 40a are provided. The reading part 60 is omitted in FIG. 11A.

In a magnetic memory device 116, the first switch part 40a includes a first transistor TR1 and a second transistor TR2.

The first transistor TR1 serves as the first switch 41. The first transistor TR1 is p-type MOSFET. The first transistor TR1 includes a first gate GT1, a first source/drain region SD1, and a second source/drain region SD2. The first signal sg1 (the first data signal) is supplied into the first gate GT1. The first source/drain region SD1 is connected with the first magnetic part 11. The second source/drain region SD2 is connected with the source of current 81.

The second transistor TR2 serves as the second switch 42. The second transistor TR2 is n-type MOSFET. The second transistor TR2 includes a second gate GT2, a third source/drain region SD3 and a fourth source/drain region SD4. The first signal sg1 (the first data signal) is supplied into the second gate GT2. The third source/drain region SD3 is connected with the second magnetic part 12. The fourth source/drain region SD4 is connected with the source of current 81.

As illustrated in FIG. 11B, in another magnetic memory device 116a according to the embodiment, the source of current 81 in the magnetic memory device 116 is replaced by a source of voltage 81a. The second source/drain region SD2 is connected with the source of voltage 81a. The fourth source/drain region SD4 is connected with the source of voltage 81a. In magnetic memory device 116a, the configurations other than this are same as those of the magnetic memory device 116.

Also in the magnetic memory device 116 and the magnetic memory device 116a, the stable writing is obtained by using two transistors. According to the embodiment, the magnetic memory device in which a stable operation is possible can be provided.

Figure 12A:
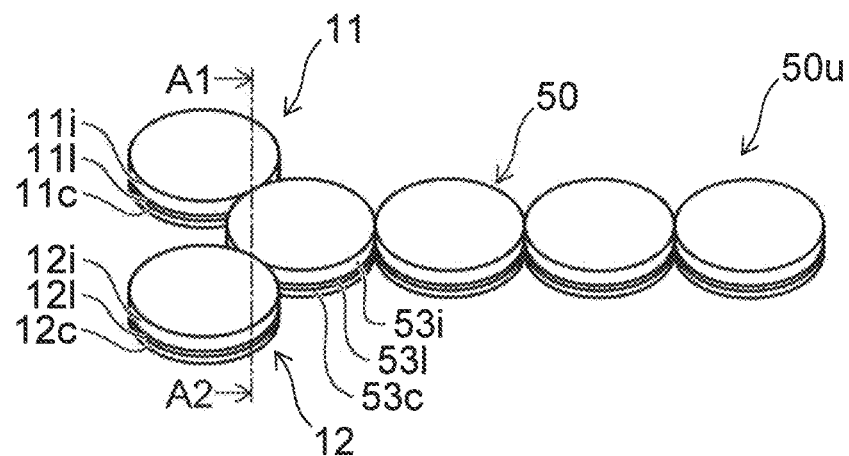
FIG. 12A and FIG. 12B are schematic views illustrating a part of magnetic memory devices according to the first embodiment.
Figure 12B:
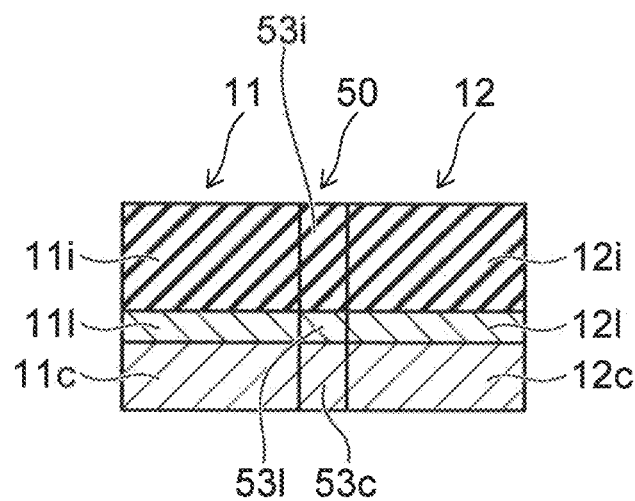

FIG. 12A and FIG. 12B are schematic views illustrating a part of magnetic memory devices according to the first embodiment.

FIG. 12A is a schematic perspective view illustrating the magnetic unit 50u. FIG. 12B is a cross-sectional view of line A1-A2 of FIG. 12A.

As shown in FIG. 12A and FIG. 12B, the first magnetic part 11 includes the first magnetic layer 11l, the first non-magnetic conductive layer 11c and the first insulating layer 11i. In this example, the first magnetic layer 11l is provided between the first non-magnetic conductive layer 11c and the first insulating layer 11i.

The second magnetic part 12 includes the second magnetic layer 12l, the second non-magnetic conductive layer 12c and the second insulating layer 12i. In this example, the second magnetic layer 12l is provided between the second non-magnetic conductive layer 12c and the second insulating layer 12i.

The first magnetic wire 50 includes the wire magnetic layer 53l, a wire non-magnetic conductive layer 53c and a wire insulating layer 53i. In this example, the wire magnetic layer 53l is provided between the wire non-magnetic conductive layer 53c and the wire insulating layer 53i.

For the first non-magnetic conductive layer 11c, the second non-magnetic conductive layer 12c and the wire non-magnetic conductive layer 53c, a metal can be used. For the first insulating layer 11l, the second insulating layer 12i and the wire insulating layer 53i, an oxide etc. can be used, for example.

Figure 13A:
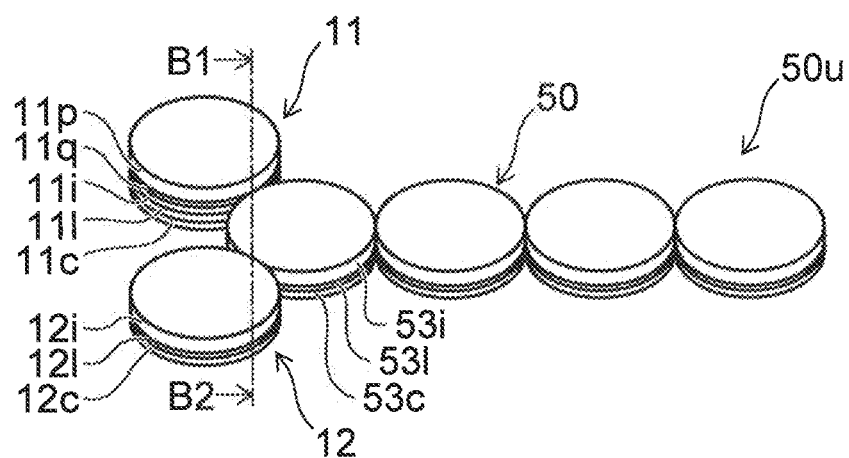
FIG. 13A and FIG. 13B are schematic views illustrating a part of magnetic memory devices according to the first embodiment.
Figure 13B:
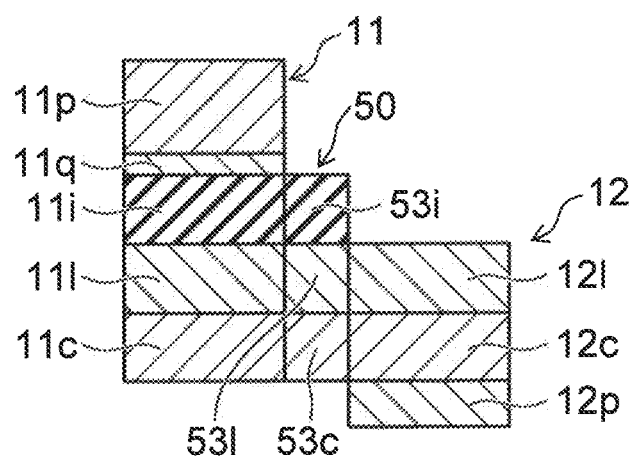

FIG. 13A and FIG. 13B are schematic views illustrating a part of magnetic memory devices according to the first embodiment.

FIG. 13A is a schematic perspective view illustrating the magnetic unit 50u, FIG. 13B is a cross-sectional view of line B1-B2 of FIG. 13A.

As shown in FIG. 13A and FIG. 13B, the first magnetic part 11 includes the first magnetic layer 11l, the first non-magnetic conductive layer 11c, the first insulating layer 11i, a layer 11p and a layer 11q. The layer 11p is provided between the first insulating layer 11i and the layer 11q. A magnetic layer or a non-magnetic layer is used for the layer 11p, for example. The layer 11q is an intermediate layer. For example, at least one of platinum, ruthenium, gold and copper can be used for the layer 11p and the layer 11q.

On the other hand, the second magnetic part 12 includes the second magnetic layer 12l, the second non-magnetic conductive layer 12c and the second insulating layer 12i and layer 12p. The second non-magnetic conductive layer 12c is provided between layer 12p and the second magnetic layer 12l.

In this way, the number of the layers included in the first magnetic part 11 may differ from the number of the layers included in the second magnetic part 12. The number of the layers included in the first magnetic part 11 may differ from the number of the layers included in the first magnetic wire 50. The number of the layers included in the second magnetic part 12 may differ from the number of the layers included in the first magnetic wire 50. Each thickness of the first magnetic part 11, second magnetic part 12 and the first magnetic wire 50 may differ mutually.

FIG. 14A to FIG. 14J are schematic views illustrating magnetic memory devices according to the first embodiment.

These figures are cross-sectional views corresponding to a section of line A1-A2 of FIG. 13A. These figures show examples of the configuration of the first magnetic part 11, second magnetic part 12 and the first magnetic wire 50 which are used in the embodiment.

As shown in FIG. 14A, the first magnetic part 11 includes the first magnetic layer 11l, the first non-magnetic conductive layer 11c and a first ferromagnetic layer 11la and a first antiferromagnetic layer 11af. The first non-magnetic conductive layer 11c is provided between the first magnetic layer 11l and the first antiferromagnetic layer 11af. The first ferromagnetic layer 11la is provided between the first non-magnetic conductive layer 11c and the first antiferromagnetic layer 11af. In this example, the magnetization of the first ferromagnetic layer 11la is anti-parallel to the magnetization of the first magnetic layer 11l. The first antiferromagnetic layer 11af produces an exchange interaction in an interface between the antiferromagnetic layer and the ferromagnetic layer. The first non-magnetic conductive layer 11c induces RKKY coupling between the first magnetic layer 11l and the first ferromagnetic layer 11la. In this example, the second magnetic part 12 includes the second magnetic layer 12l and a second antiferromagnetic layer 12af. The first magnetic wire 50 includes the wire magnetic layer 53l.

As shown in FIG. 14B, the second magnetic part 12 includes the second magnetic layer 12l, the second non-magnetic conductive layer 12c, a second ferromagnetic layer 12la and a second antiferromagnetic layer 12af. In this example, the second magnetic layer 12l is provided between the second ferromagnetic layer 12la and the second antiferromagnetic layer 12af. The second non-magnetic conductive layer 12c is provided between the second magnetic layer 12l and the second ferromagnetic layer 12la. In this example, the magnetization of the second ferromagnetic layer 12la is anti-parallel to the magnetization of the second magnetic layer 12l. The second antiferromagnetic layer 12af produces an exchange interaction in the interface between the antiferromagnetic layer and the ferromagnetic layer. The second non-magnetic conductive layer 12c induces RKKY coupling between the second magnetic layer 12l and the second ferromagnetic layer 12la. In this example, the first magnetic wire 50 includes the wire magnetic layer 53l and a wire non-magnetic conductive layer 53c. The first non-magnetic conductive layer 11c, the wire non-magnetic conductive layer 53c and the second non-magnetic conductive layer 12c are positioned in a common plane.

As shown in FIG. 14C, the first magnetic part 11 includes the first magnetic layer 11l, the first non-magnetic conductive layer 11c and the first ferromagnetic layer 11la.

As shown in FIG. 14D, the second magnetic part 12 includes the second magnetic layer 12l and the second antiferromagnetic layer 12af.

As shown in FIG. 14E, the first magnetic part 11 includes the first magnetic layer 11l, the first non-magnetic conductive layer 11c, the first ferromagnetic layer 11la and the antiferromagnetic layer 11af.

As shown in FIG. 14F, the first magnetic part 11 includes the first magnetic layer 11l, the first non-magnetic conductive layer 11c and the first ferromagnetic layer 11la. In this example, the magnetization of the first ferromagnetic layer 11*la* is anti-parallel (that is, reverse) to the magnetization of the first magnetic layer 11*l*.

As shown in FIG. 14G, the first magnetic part 11 includes the first magnetic layer 11*l*, the first non-magnetic conductive layer 11*c* and the first ferromagnetic layer 11*la*. In this example, the magnetization of the first ferromagnetic layer 11*la* is parallel (that is, the same direction) to the magnetization of the first magnetic layer 11*l*.

As shown in FIG. 14H, the thickness of the second magnetic layer 12*l* differs from the thickness of the first magnetic layer 11*l*. In this example, the thickness of the second magnetic layer 12*l* is thicker than the thickness of the first magnetic layer 11*l*.

As shown in FIG. 14I, the first magnetic wire 50 includes the wire magnetic layer 53*l*. The thickness of the wire magnetic layer 53*l* is thicker than the thickness of the first magnetic layer 11*l*, and thinner than the thickness of the second magnetic layer 12*l*.

As shown in FIG. 14J, the thickness of the wire magnetic layer 53*l* is the same as the thickness of the first magnetic layer 11*l*. The thickness of the second magnetic layer 12*l* is thicker than the thickness of the first magnetic layer 11*l*.

In addition to the above, in the embodiment, various configurations can be used to the layers.

Figure 15:
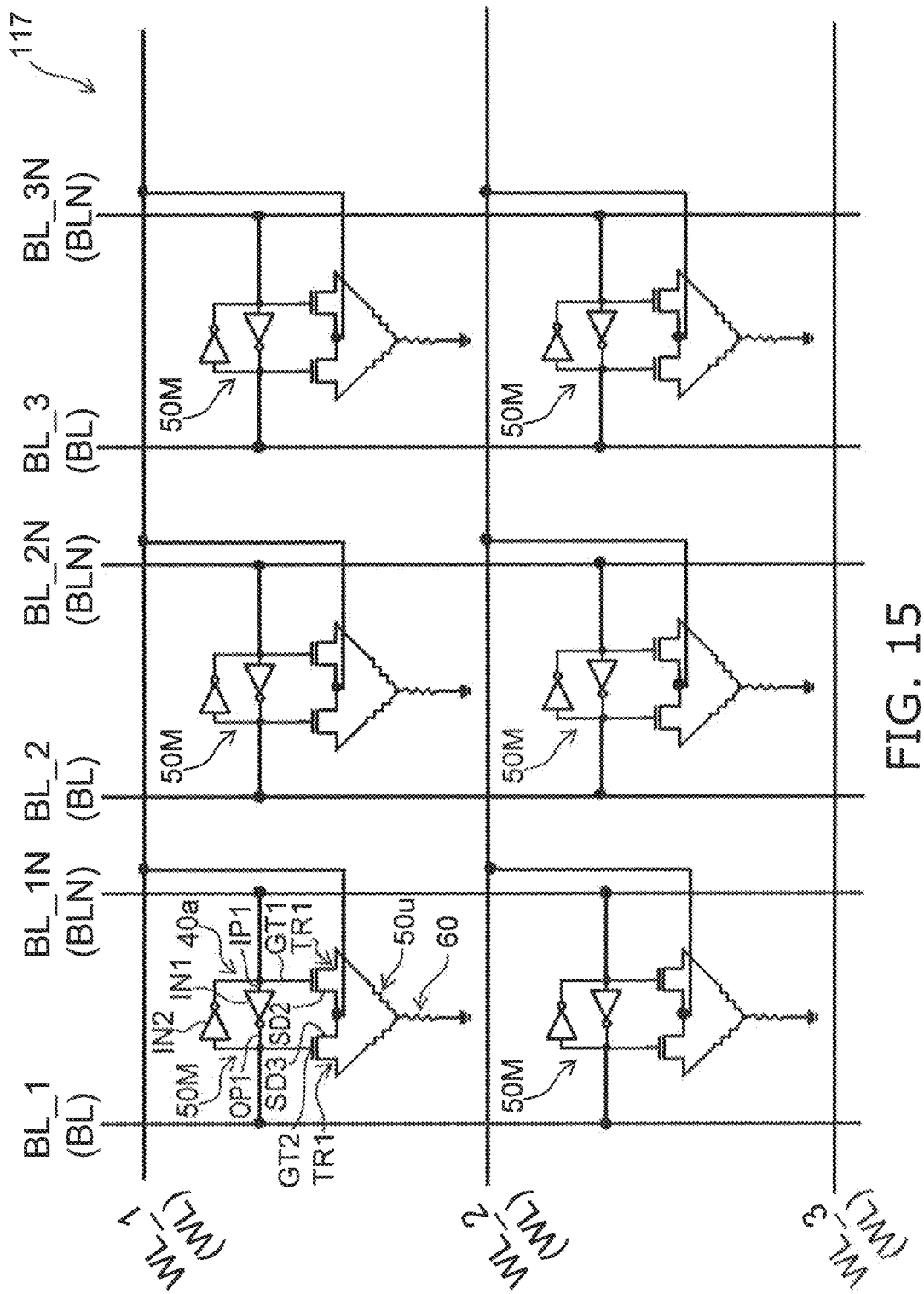
FIG. 15 is a schematic view illustrating a magnetic memory device according to the first embodiment.

FIG. 15 is a schematic view illustrating a magnetic memory device according to the first embodiment.

As illustrated in FIG. 15, in a magnetic memory device 117, a plurality of memory part 50M are provided. One memory part 50M includes the magnetic unit 50*u*, the first switch part 40*a* and the reading part 60. The plurality of memory part 50M are provided, for example, in a matrix configuration.

In the magnetic memory device 117, a plurality of word lines WL are provided. The plurality of word lines WL includes, for example, a first word line WL_1, a second word line WL_2 and a third word line WL_3 etc. The plurality of word lines WL extend in one direction.

In the magnetic memory device 117, a plurality of bit lines BL are provided. The plurality of bit lines BL includes, for example, a first bit line BL_1, a second bit line BL_2 and a third bit line BL_3 etc. The plurality of bit lines BL extend in one direction.

In the magnetic memory device 117, a plurality of bit line bars BLN are provided. The plurality of bit line bars BLN include, for example, a first bit line bar BL_1N, a second bit line bar BL_2N and a third bit line bar BL_3N etc. The plurality of bit line bars BLN extend in the one direction.

For example, the direction in which the bit line bars BLN extend is parallel to the direction in which the bit lines BL extend. The direction in which the word lines WL extend intersects the direction in which the bit lines BL extend.

In this example, the first switch part 40*a* has the configuration explained with respect to the magnetic memory device 110. The second source/drain region SD2 is provided in the first transistor TR1. The third source/drain region SD3 is provided in the second transistor TR2. The second source/drain region SD2 and the third source/drain region SD3 are connected with one word line WL. In this example, the first inverter IN1 and the second inverter IN2 are provided. The first inverter IN1 has the first inverter input IP 1 and the first inverter output OP1. The first inverter input IP 1 is connected with one bit line bar BLN in this example. The first inverter output OP1 is connected with one bit line BL.

Using the plurality of word lines WL, the plurality of bit lines BL, and the plurality of bit line bars BLN, data can be written independently in each of the plurality of memory parts 50M. By the plurality of memory part 50M, a memory device having the plurality of memory cells is obtained.

Figure 16:
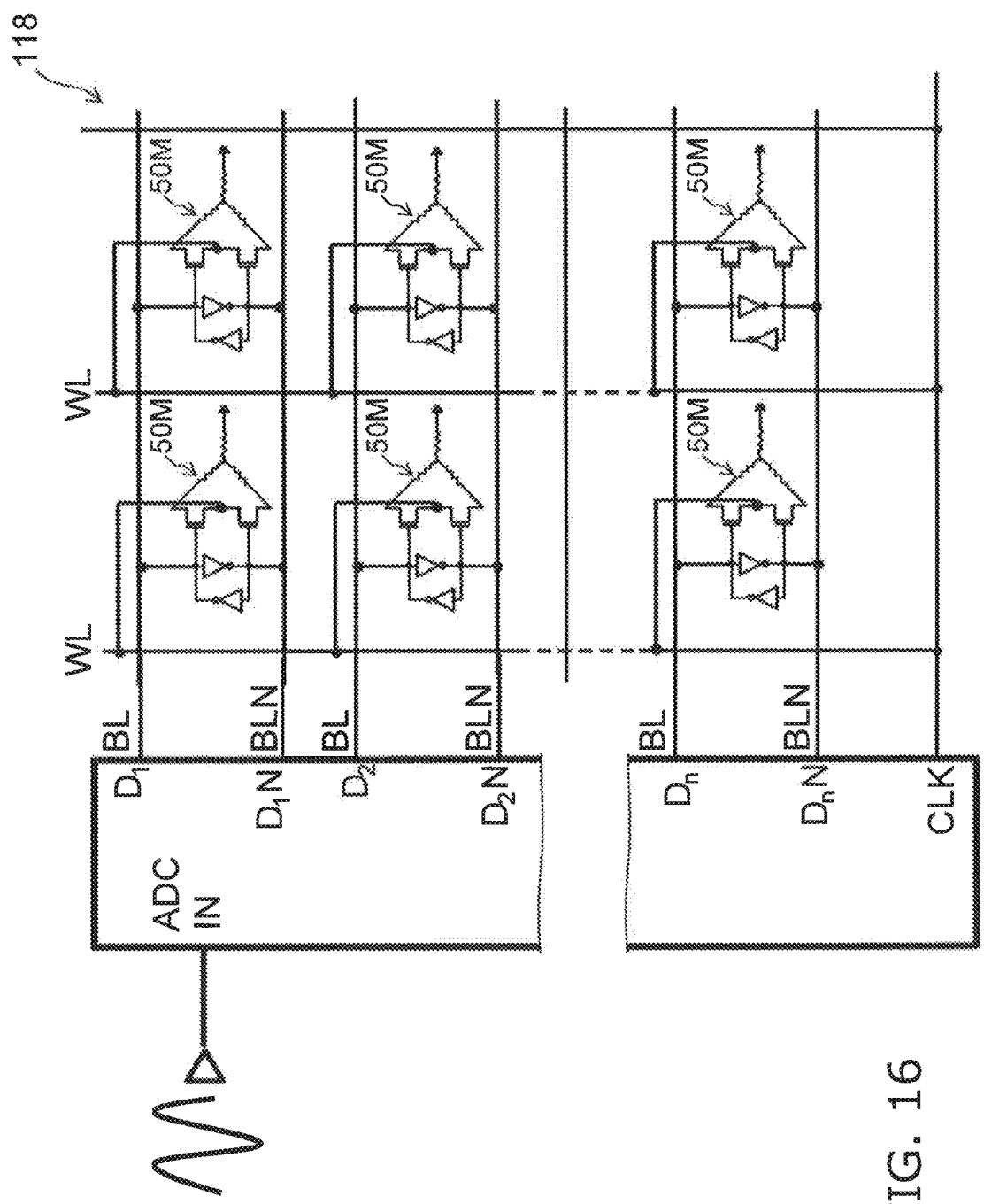
FIG. 16 is a schematic view illustrating a magnetic memory device according to the first embodiment.

FIG. 16 is a schematic view illustrating a magnetic memory device according to the first embodiment.

As illustrated in FIG. 16, an analog to digital converter ADC is provided in the magnetic memory device 118. The clock signal CLK is outputted from the analog to digital converter ADC. A plurality of logic outputs are outputted from the analog to digital converter ADC. The plurality of logic outputs include outputs $D_1, D_2,$ and $D_n$ etc. The plurality of logic outputs include output $D_1N, D_2N,$ and $D_nN$ etc.

For example, the clock signal CLK is supplied to each of the plurality of word lines WL. Outputs $D_1, D_2,$ and $D_n$ etc. are supplied to each of the plurality of bit lines BL, respectively. Outputs $D_1N, D_2N,$ and $D_nN$ etc. are supplied to each of the plurality of bit line bars BLN, respectively.

In the magnetic memory device 118, the information supplied into the analog to digital converter ADC is stored.

Second Embodiment

Figure 17:
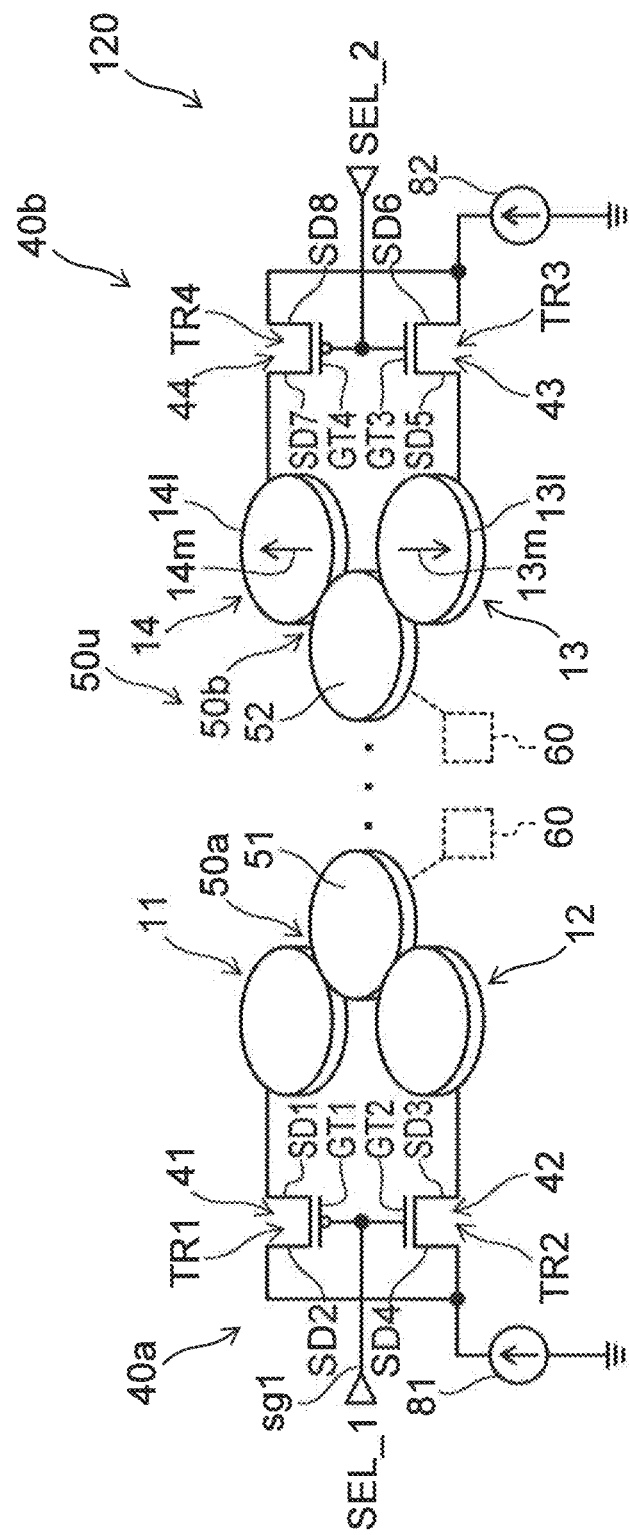
FIG. 17 is a schematic view illustrating a magnetic memory device according to the second embodiment.

FIG. 17 is a schematic view illustrating a magnetic memory device according to the second embodiment.

As illustrated in FIG. 17, the magnetic memory device 120 according to the embodiment further includes a second switch part 40*b* in addition to the magnetic unit 50*u*, the first switch part 40*a* and the reading part 60. The magnetic unit 50*u* further includes a third magnetic part 13 and a fourth magnetic part 14, in addition to the first magnetic wire 50, the first magnetic part 11 and the second magnetic part 12. In this example, in the magnetic memory device 120, a first control port SEL_1 and a second control port SEL_2 are provided.

For the first magnetic wire 50, the first magnetic part 11 and the second magnetic part 12, the configurations described with respect to the above-mentioned embodiment can be used. For the first switch part 40*a* and the reading part 60, the configurations described with respect to the above-mentioned embodiment can be used. Below, examples of the magnetic unit 50*u* and second switch part 40*b* will be described.

The third magnetic part 13 provided in magnetic unit 50*u* is connected with the other ends (second end 50*b*) of the first magnetic wire. The third magnetic part 13 has a third magnetization 13*m*.

The fourth magnetic part 14 is connected with the above-mentioned other ends (second end 50*b*). The fourth magnetic part 14 is apart from the third magnetic part 13. The fourth magnetic part 14 has a fourth magnetization 14*m*. The fourth magnetization 14*m* is opposite to the third magnetization 13*m*.

The configuration and material recited with respect to the first magnetic part 11 and the second magnetic part 12 are applicable to the third magnetic part 13 and the fourth magnetic part 14.

For example, the third magnetic part 13 includes a third magnetic layer 13*l*. The third magnetic layer 13*l* has, for example, perpendicular magnetic anisotropy. The magnetization of the third magnetic layer 13*l* has perpendicular anisotropy. The fourth magnetic part 14 includes a fourth magnetic layer 14*l*. The fourth magnetic layer has, for example, perpendicular magnetization anisotropy. The magnetization of the fourth magnetic layer 14*l* has perpendicular anisotropy. At least one of the third magnetic part 13 and the fourth magnetic part 14 may include at least one of a non-magnetic conductive layer and an insulating layer.

The second switch part 40*b* includes a third switch 43 and a fourth switch 44. The third switch 43 is connected with the third magnetic part 13. The third switch 43 passes a third current between the third magnetic part 13 and the first magnetic wire 50. The fourth switch 44 is connected with the fourth magnetic part 14. The fourth switch 44 passes a fourth current between the fourth magnetic part 14 and the first magnetic wire 50.

In this example, as first switch part 40a, the configuration recited with respect to the magnetic memory device 116 is used. That is, the first transistor TR1 of p-type MOSFET and the second transistor TR2 of n-type MOSFET are provided in first switch part 40a. The first gate GT1 of the first transistor TR1 is connected with the first control port SEL_1. The second gate GT2 of the second transistor TR2 is also connected with the first control port SEL_1. The first signal sg1 is supplied to the first control port SEL_1.

On the other hand, p-type MOSFET and n-type MOSFET are provided also in the second switch part 40b. That is, the second switch part 40b includes a third transistor TR3 and a fourth transistor TR4.

The third transistor TR3 serves as the third switch 43. The third transistor TR3 is p-type MOSFET. The third transistor TR3 includes a third gate GT3, a fifth source/drain region SD5 and a sixth source/drain region SD6. The third gate GT3 is connected with control port SEL_2. The fifth source/drain region SD5 is connected with the third magnetic part 13. The sixth source/drain region SD6 is connected with the source of current 82.

The fourth transistor TR4 serves as the fourth switch 44. The fourth transistor TR4 is n-type MOSFET. The fourth transistor TR4 includes a fourth gate GT4, a seventh source/drain region SD7 and the eighth source/drain region SD8. The fourth gate GT is connected with the second control port SEL_2. The seventh source/drain region SD7 is connected with the fourth magnetic part 14. The eighth source/drain region SD8 is connected with the source of current 82.

By signals applied to the first control port SEL_1 and the second control port SEL_2, currents can be passed in various paths on the first magnetic wire 50.

For example, the current can be passed in a path including the first magnetic part 11, the first magnetic wire 50 and the third magnetic part 13. The current can be passed in a path including the first magnetic part 11, the first magnetic wire 50 and the fourth magnetic part 14. The current can be passed in a path including the second magnetic part 12, the first magnetic wire 50 and the third magnetic part 13. The current can be passed in a path including the second magnetic part 12, the first magnetic wire 50 and the fourth magnetic part 14. The directions of these currents are arbitrary.

In the magnetic memory device 120, the writing from the first end 50a side of the first magnetic wire 50 and the writing from the second end 50b side of the first magnetic wire 50 can be changed and performed. In the embodiment, the flexibility of writing operation increases, for example. Operation with more stability is obtained.

Figure 18:
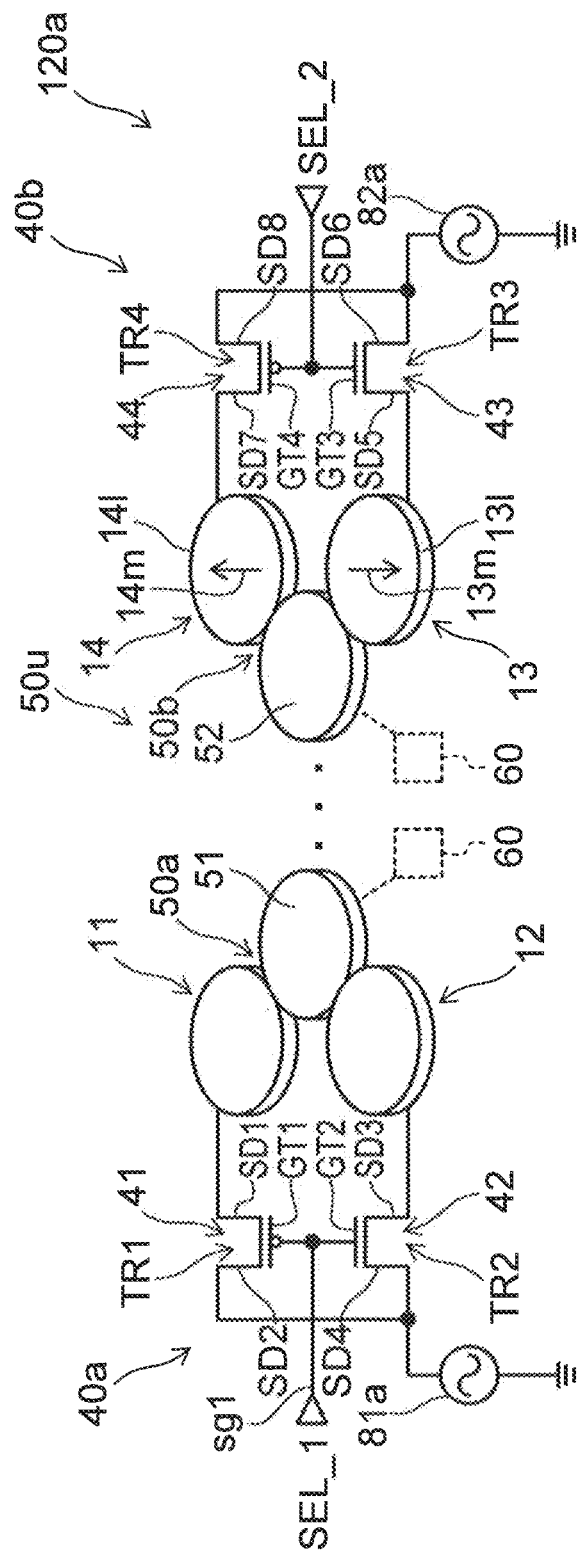
FIG. 18 is a schematic view illustrating a magnetic memory device according to the second embodiment.

FIG. 18 is a schematic view illustrating a magnetic memory device according to the second embodiment.

As illustrated in FIG. 18, in another magnetic memory device 120a according to the embodiment, the source of current 81 in the magnetic memory device 116 is replaced with a source of voltage 81a. And the source of current 82 is replaced with a source of voltage 82a. The second source/drain region SD2 is connected with the source of voltage 81a. The fourth source/drain region SD4 is connected with the source of voltage 81a. The sixth source/drain region SD6 is connected with the source of voltage 82a. The eighth source/drain region SD8 is connected with the source of voltage 82a.

Also in magnetic memory device 120a, the stable writing is obtained by using two transistors. And the flexibility of writing operation is increased by using two switch parts.

Figure 19:
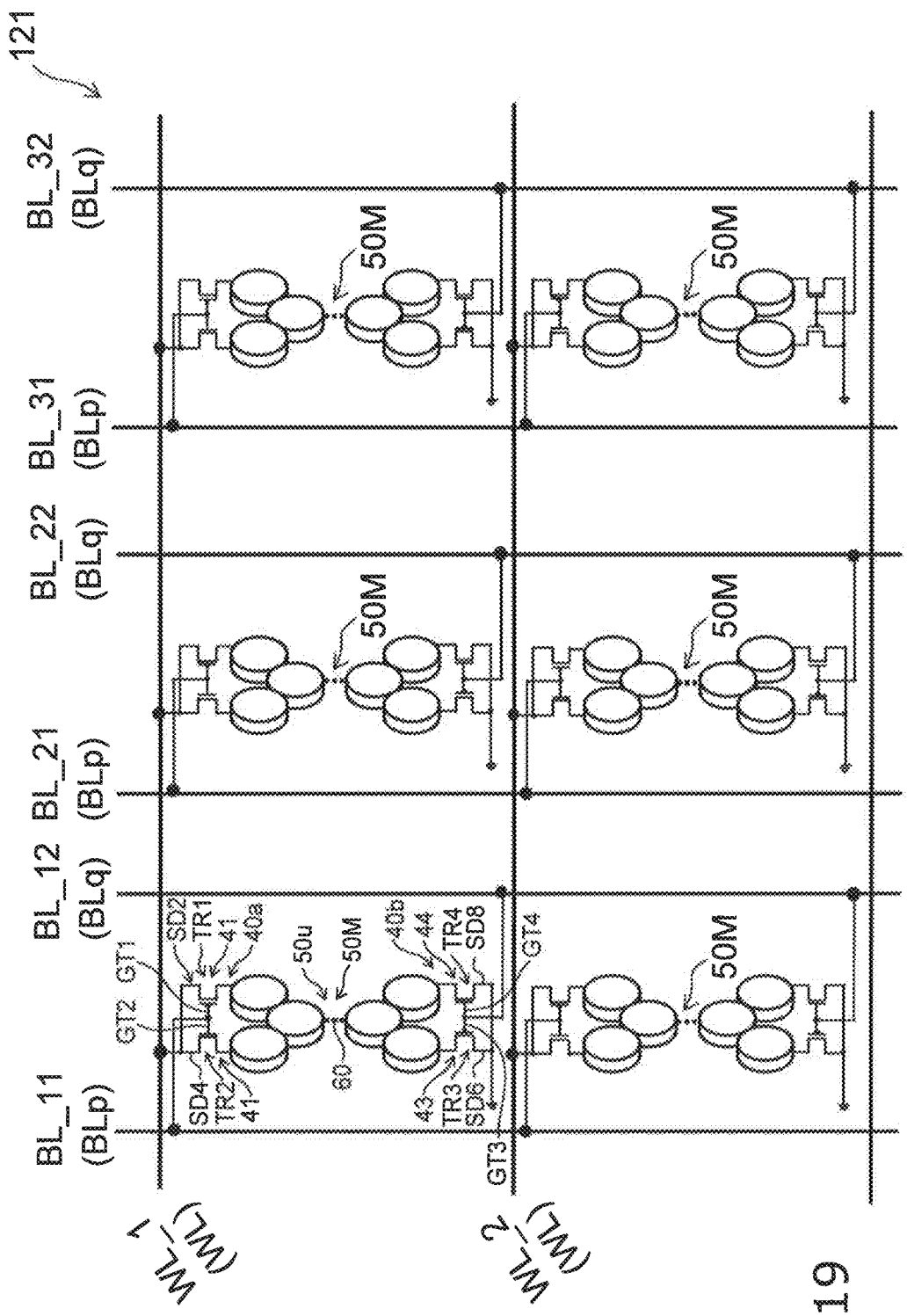
FIG. 19 is a schematic view illustrating a magnetic memory device according to the second embodiment.

FIG. 19 is a schematic view illustrating a magnetic memory device according to the second embodiment.

As illustrated in FIG. 19, in a magnetic memory device 121, a plurality of memory part 50M are provided. One memory part 50M includes the magnetic unit 50u, the first switch part 40a, the second switch part 40b and the reading part 60. The plurality of memory parts 50M are provided, for example, in a matrix configuration.

A plurality of word lines WL (the first word line WL_1 and the second word line WL_2 etc.) are provided.

A plurality of bit lines BLp are provided. The plurality of bit lines BLp include a bit line BL_11, a bit line BL_21, a bit line BL_31, etc.

A plurality of bit lines BLq are provided. The plurality of bit lines BLq include a bit line BL_12, a bit line BL_22, a bit line BL_22, etc.

For example, the direction in which the bit lines BLq extend is parallel to the direction in which the bit lines BLp extend. The direction in which the word lines WL extend intersects the direction in which the bit lines BLp extend.

In this example, the first switch part 40a and the second switch part 40b have configurations recited with respect to the magnetic memory device 120.

The first gate GT1 and the second gate GT2 are connected with one of the bit lines BLp. The second source/drain region SD2 and the fourth source/drain region SD4 are connected with one of the word lines WL.

The third gate GT3 and the fourth gate GT4 are connected with one of the bit lines BLq. The sixth source/drain region SD6 and the eighth source/drain region SD8 are set at a predetermined potential (for example, ground potential).

Using the plurality of word lines WL, the plurality of bit lines BLp and the plurality of bit lines BLq, data can be written independently in each of the plurality of memory parts 50M. The memory device having a plurality of memory cells can be obtained by the plurality of memory parts 50M.

Third Embodiment

Figure 20:
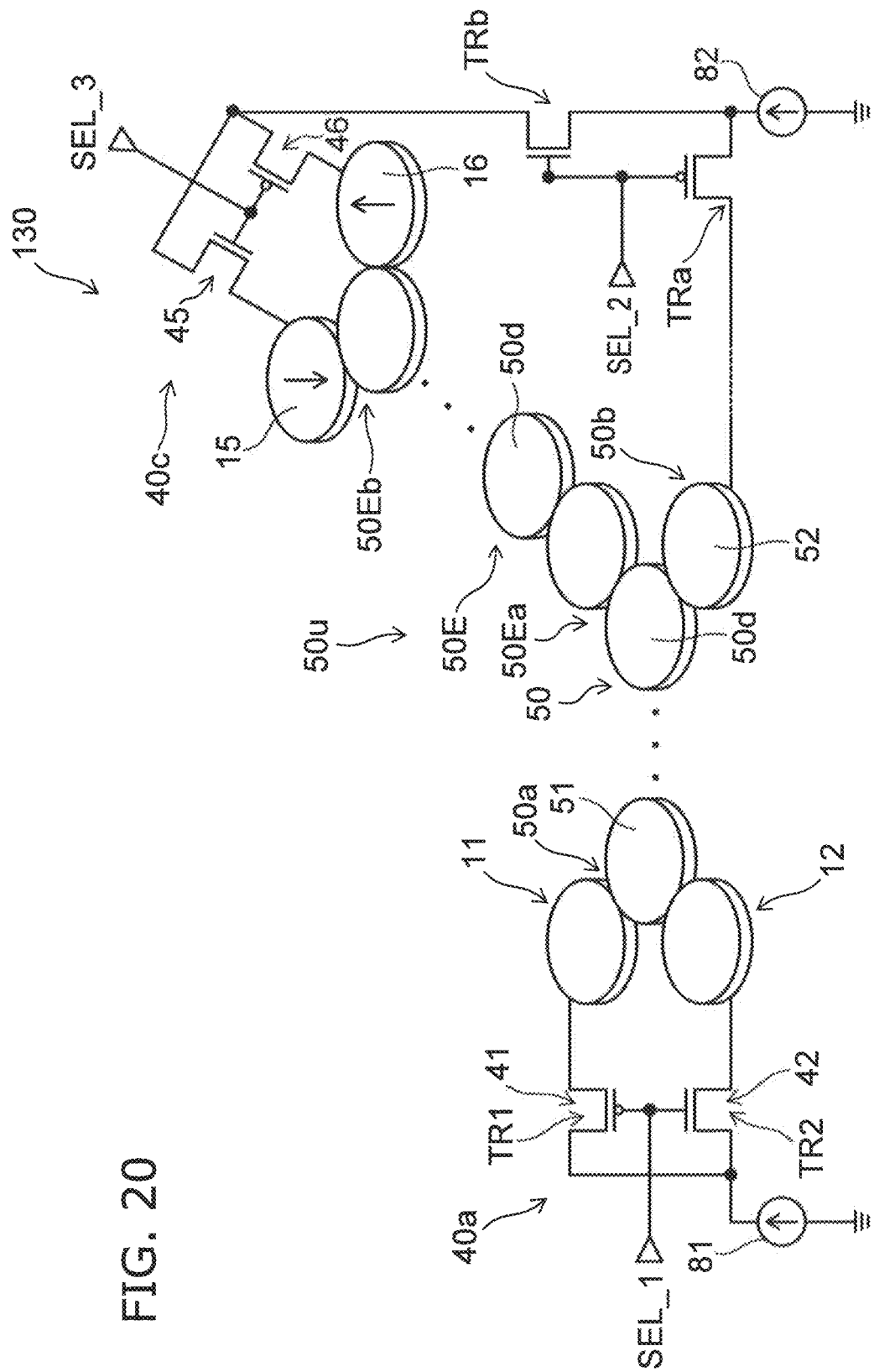
FIG. 20 is a schematic view illustrating a magnetic memory device according to the third embodiment.

FIG. 20 is a schematic view illustrating a magnetic memory device according to the third embodiment.

As illustrated in FIG. 20, in the magnetic memory device 130 according to the embodiment, the magnetic unit 50u further includes a second magnetic wire 50E in addition to the first magnetic wire 50. In this example, a third switch part 40c and a first control port SEL_1, a second control port SEL_2 and a third control port SEL_3 are provided. The reading part 60 is omitted in this figure.

The second magnetic wire 50E has an end (a third end 50Ea) and other end (a fourth end 50Eb). The end of the second magnetic wire 50E is connected with the first magnetic wire 50.

In this example, the magnetic unit 50u further includes a fifth magnetic part 15 and a sixth magnetic part 16. The fifth magnetic part 15 is connected with the other ends of second magnetic wire 50E. The sixth magnetic part 16 is apart from the fifth magnetic part 16. The sixth magnetic part 16 is connected with the other ends of second magnetic wire 50E. The magnetization of the sixth magnetic part 16 is opposite to the magnetization of the fifth magnetic part 15.

In this example, the third switch part 40c includes a fifth switch 45 and a sixth switch 46. The end (one of source/drain regions) of the fifth switch 45 is connected with the fifth magnetic part 15. The end (one of source/drain regions) of the sixth switch 46 is connected with the sixth magnetic part 16. The gate of the fifth switch 45 and the gate of the sixth switch 46 are connected with the control port SEL_3.

On the other hand, the first switch 41 and the second switch 42 are provided in first switch part 40a. The gate of the first switch 41 and the gate of the second switch 42 are connected with the first control port SEL_1.

In this example, the other end (second end 50b) of the first magnetic wire 50 is connected with the end of a transistor TRa. The other end of the transistor TRa is connected with the source of current 82. A transistor TRb is provided between the source of current 82 and the third switch part 40c. The gate of the transistor Tra and the gate of the transistor TRb are connected with the second control port SEL_2.

Other end (another source/drain region) of the fifth switch 45 and the other end (another source/drain region) of the sixth switch 46 are connected with the end of the transistor TRb. The other end of Transistor TRb is connected with the source of current 82.

In the magnetic memory device 130, a current can be passed in six paths, for example. For example, a current can be passed in a path between the first end 50a of the first magnetic wire 50 and the second end 50b of the first magnetic wire 50. For example, a current can be passed in a path between the first end 50a of the first magnetic wire 50 and the fourth end 50Eb of the second magnetic wire 50E. A current can be passed in a path between the fourth end 50Eb of the second magnetic wire 50E and the second end 50b of the first magnetic wire 50.

Flexibility of the operation can be further increased by choosing the path of the current from six paths.

Fourth Embodiment

Figures 21A, 21B:
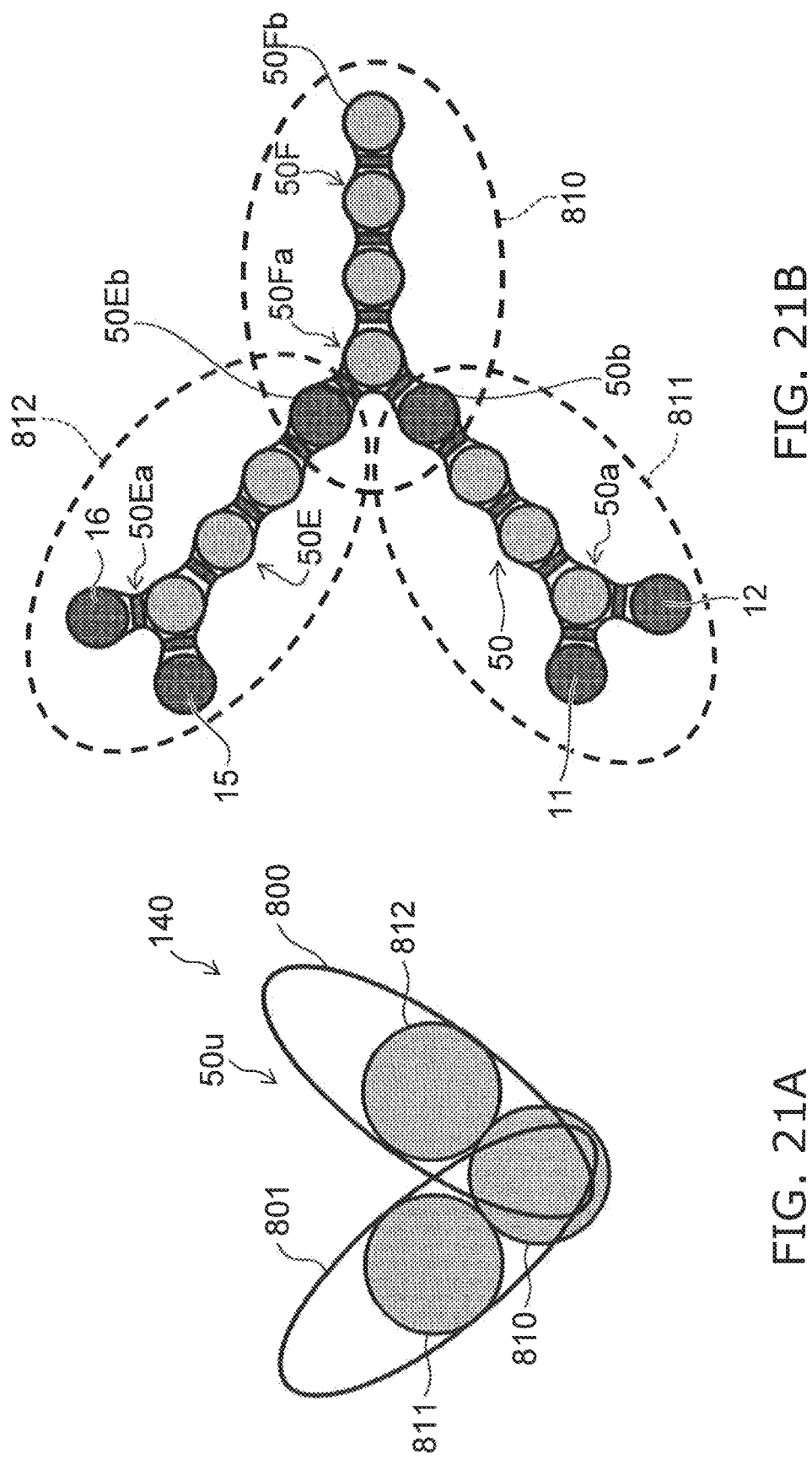
FIG. 21A and FIG. 21B are schematic views illustrating a magnetic memory device according to the fourth embodiment.

FIG. 21A and FIG. 21B are schematic views illustrating a magnetic memory device according to the fourth embodiment.

As illustrated in FIG. 21A, in the magnetic memory device 140 according to the embodiment, the magnetic unit 50u includes a plurality of memory blocks. In this example, a memory block 800, a memory block 801, etc. are provided. The memory block 800 includes a memory string 812. The memory block 801 includes a memory string 811. In this example, a memory string 810 is shared by the memory block 800 and the memory block 801.

As shown in FIG. 21B, the memory string 811 includes the first magnetic wire 50. The memory string 812 includes the second magnetic wire 50E. The memory string 810 includes the third magnetic wire 50F. The third magnetic wire 50F has an end (the fifth end 50Fa) and other ends (the sixth end 50Fb). For example, the second end 50b of the first magnetic wire 50 and the fourth end 50Eb of the second magnetic wire 50E are connected with a fifth end 50Fa of the third magnetic wire 50F. For example, the portion at a confluence of a plurality of memory strings serves as an end of another memory string.

Flexibility of the operation is increased by passing currents in a plurality of paths. For example, in the case of storing information including redundant data, the device can be down-scaled.

For example, the part 60 may be provided in one of a plurality of memory strings and it may be omitted in other memory strings. By omitting, a down-scaling of the device can be made and cost can be reduced.

The velocity of the shift of the data in the plurality of memory strings may differ mutually. A portion for storing information in high density and a portion for high speed operation may be provided.

Figure 22:
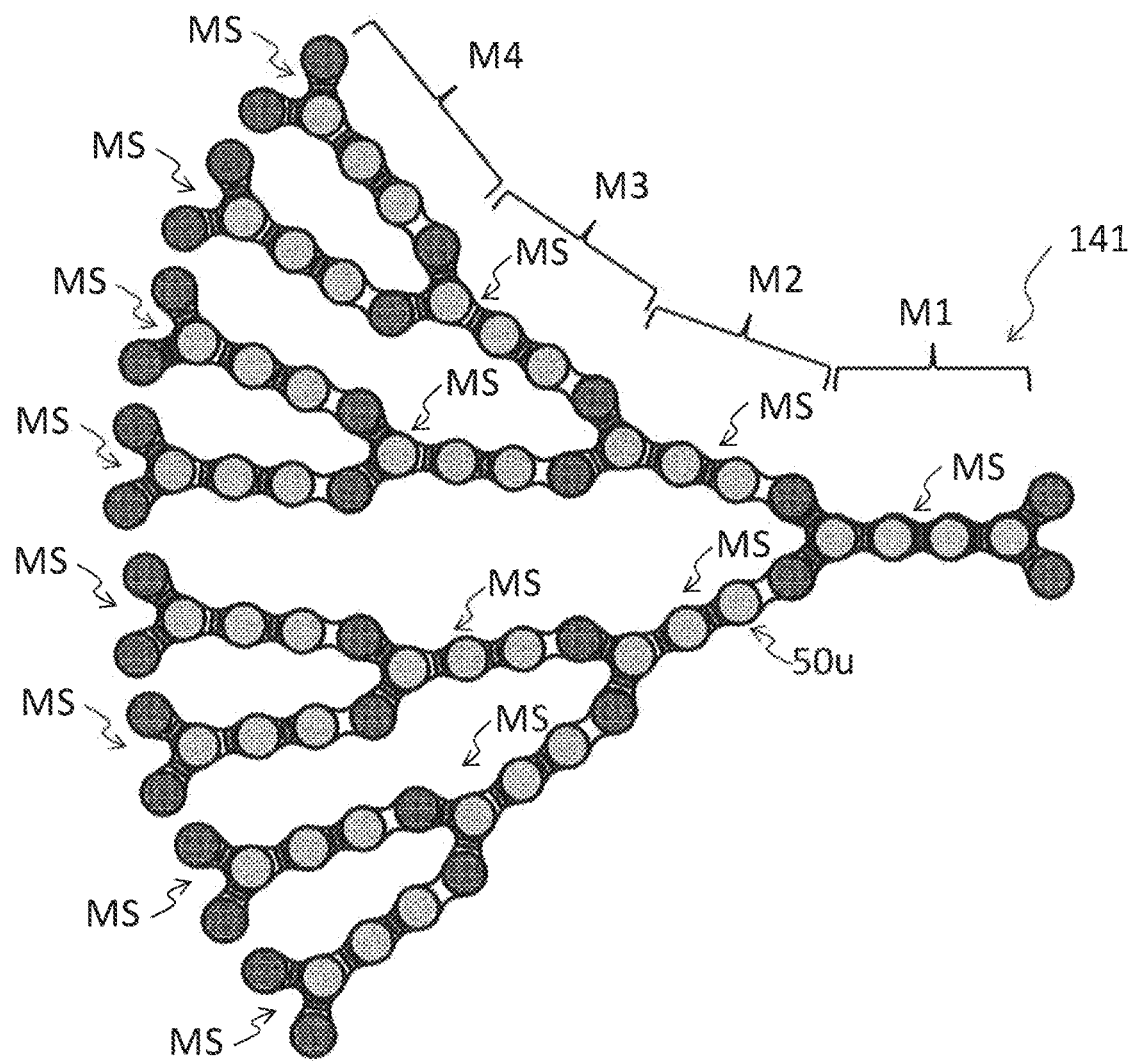
FIG. 22 is a schematic view illustrating a magnetic memory device according to the fourth embodiment.

FIG. 22 is a schematic view illustrating a magnetic memory device according to the fourth embodiment.

As illustrated in FIG. 22, in the magnetic memory device 141 according to the embodiment, a plurality of memory regions (a first memory region M1 to a fourth memory region M4, etc.) are provided in magnetic unit 50u. The memory string MS is provided in each memory region.

For example, one memory string MS is provided in the first memory region M1. In the second memory region M2, two memory strings MS are provided in parallel. In the third memory region M3, $2^2=4$ memory strings MS are provided in parallel. In the fourth memory region M4, $2^3=8$ memory strings MS are provided in parallel. Thus, a hierarchy is provided in a memory. For example, in the fourth memory region M4, a cash level is high and the size of memory is large compared with the first memory region M1.

For example, the first memory region M1 corresponds to a high-speed access memory. For example, in the first memory region M1, important data is stored. For example, the second memory region M2 corresponds to a low-speed access memory. For example, in the second memory region M2, mass data is stored. Storing information in accordance with purpose can be performed.

Figure 23:
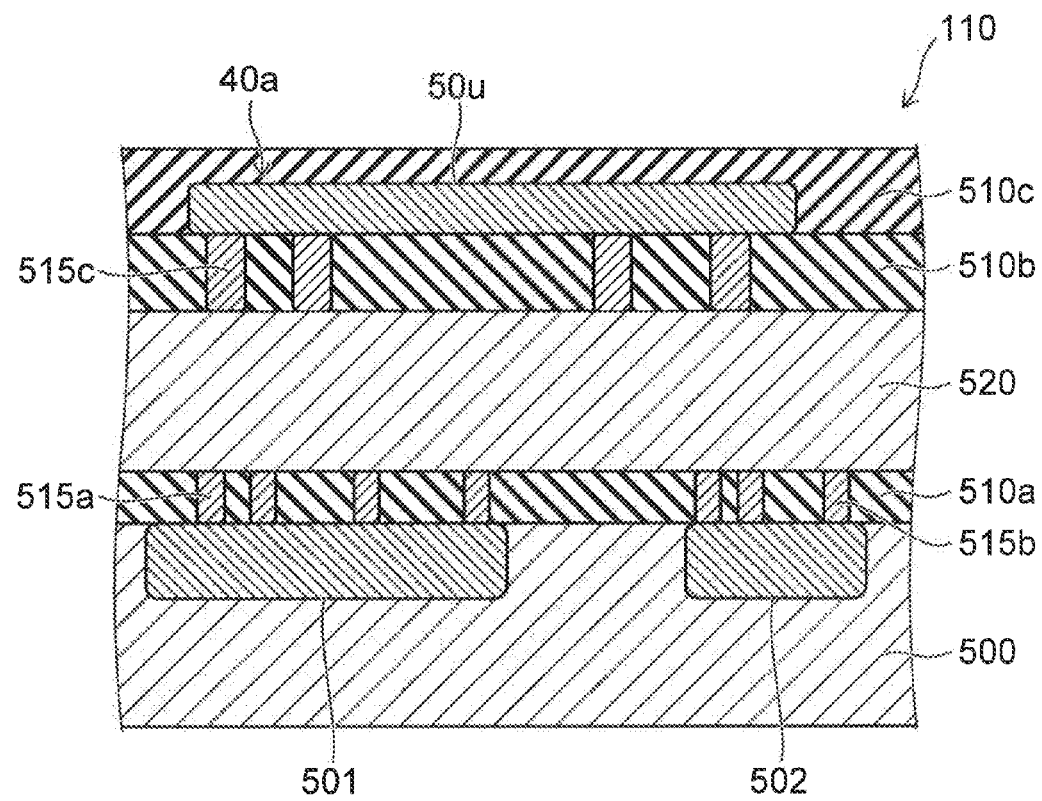
FIG. 23 is a schematic sectional view illustrating a magnetic memory device according to the embodiment.

FIG. 23 is a schematic sectional view illustrating a magnetic memory device according to the embodiment.

In FIG. 23, a structure in case the magnetic memory device 110 is provided on a substrate is shown as an example. The reading part 60 is omitted in this figure.

For example, a substrate 500 is provided. A silicon substrate etc. is used for the substrate 500. A first dope domain 501 and a second dope domain 502 are provided in a part of substrate 500. The first insulating layer 510a is provided on a substrate 500.

The metal wiring layer 520 is provided on the first insulating layer 510a. The metal wiring layer 520 includes a plurality of conductive layers (not shown). A via wiring 515a and a via wiring 515b are provided. The via wiring 515a and the via wiring 515b penetrate the first insulating layer 510a. The via wiring 515a connects the first dope domain 501 and one of conductive layer in the metal wiring layer 520. The via wiring 515b connects the second dope domain 502 and one of conductive layer in the metal wiring layer 520.

A second insulating layer 510b is provided on the metal wiring layer 520. The magnetic unit 50u and the switch parts (the first switch part 40a etc.) are provided on a part of the second insulating layer 510. A via wiring 515c is provided. The via wiring 515c penetrates second insulating layer 510b. The via wiring 515c connects electrically one of the conductive layer in the metal wiring layer 520 and the magnetic unit 50u. For example, the via wiring 515c is connected with the conductive layer connected with first switch part 40a.

A third insulating layer 510c is provided on the magnetic unit 50u and first switch part 40a. The magnetic memory device 110 can be provided using a CMOS process.

Fifth Embodiment

The embodiment relates to a driving method for a magnetic memory device. The magnetic memory device to which the driving method is applied includes, for example, the magnetic unit 50u and the first switch part 40a. The magnetic unit 50u includes the first magnetic part 11, the second magnetic part 12 and the first magnetic wire 50. The first switch part 40a includes the first switch 41 and the second switch 42. The first switch 41 is connected with the first magnetic part 11. The second switch 42 is connected with the second magnetic part 12.

In this driving method, the first switch 41 is made to be in an electrical connection state to pass the first current between the first magnetic part 11 and the first magnetic wire 50, for example. In this time, the second switch 42 is made to be in a non-electrical connection state, for example, so that current does not flow substantially between the second magnetic part 12 and the first magnetic wire 50. The electrical connection state is in a low resistance state. The non-electrical connection state is in a high resistance state. A resistance of the high resistance state is higher than a resistance of the low resistance state.

In this driving method, the second switch 42 is made to be the electrical connection state to pass the second current between the second magnetic part 12 and the first magnetic wire 50, for example. In this time, the first switch 41 is made to be the non-electrical connection state, for example, so that current does not flow substantially between the first magnetic part 11 and the first magnetic wire 50. Thereby, the magnetic memory device can be operated stably.

The driving method according to the embodiment includes the driving method for the magnetic memory device including second switch part 40b.

For example, the third magnetic part 13 and the fourth magnetic part 14 are further provided in the magnetic unit 50u. The second switch part 40b includes the third switch 43 and the fourth switch 44. The third switch 43 is connected with the third magnetic part 13. The fourth switch 44 is connected with the fourth magnetic part 14.

In this driving method, the third switch 43 is made to be in the electrical connection state to pass the third current between the third magnetic part 13 and the first magnetic wire 50, for example. In this time, the fourth switch 44 is made to be in the non-electrical connection state, for example, so that current does not flow substantially between the fourth magnetic part 14 and the first magnetic wire 50.

In this driving method, the fourth switch 44 is made to be in the electrical connection state to pass the fourth current between the fourth magnetic part 14 and the first magnetic wire 50, for example. In this time, the third switch 43 is made to be in the non-electrical connection state, for example, so that current does not flow substantially between the third magnetic part 13 and the first magnetic wire 50.

In this driving method, the direction of the first current is set opposite to the direction of the third current. The direction of the second current is set opposite to the direction of the fourth current.

According to the driving method, the magnetic memory device can be operated stably.

FIG. 24A to FIG. 24F are schematic views illustrating characteristics in the magnetic memory devices according to the embodiment.

These figures illustrate simulation results of change of the magnetization in the magnetic unit 50u in the writing operation. FIG. 24A corresponds to a first state (for example, initial state). FIG. 24F corresponds to a second state (for example, end state). In FIG. 24A, time T is 0. In FIG. 24B, the time T is time ta. In FIG. 24B to FIG. 24E, the time T is 0.1xta, 0.25xta, 0.4xta, and 0.6xta, respectively. These figures illustrate a change of magnetization in case current flows between the second magnetic part 12 and the first magnetic wire 50 and current does not flow between the first magnetic part 11 and the first magnetic wire 50. The time T corresponds a time to pass, since the current begins to pass. In these figures, a bright portion corresponds to an upward magnetization and a dark portion corresponds to a downward magnetization.

As shown in FIG. 24A, when the time T is 0, the magnetization of the second magnetic part 12 is upward, and the magnetization of the first magnetic part 11 is downward. At the end (the first connection part 51) of the first magnetic wire 50, the magnetization is downward. As time advances, the second connection part magnetic wall 50wb moves. And the magnetization of the first connection part 51 changes. As shown in FIG. 24F, when the time T is time ta, the magnetization of the first connection part 51 changes upward.

Figures 25A, 25B:
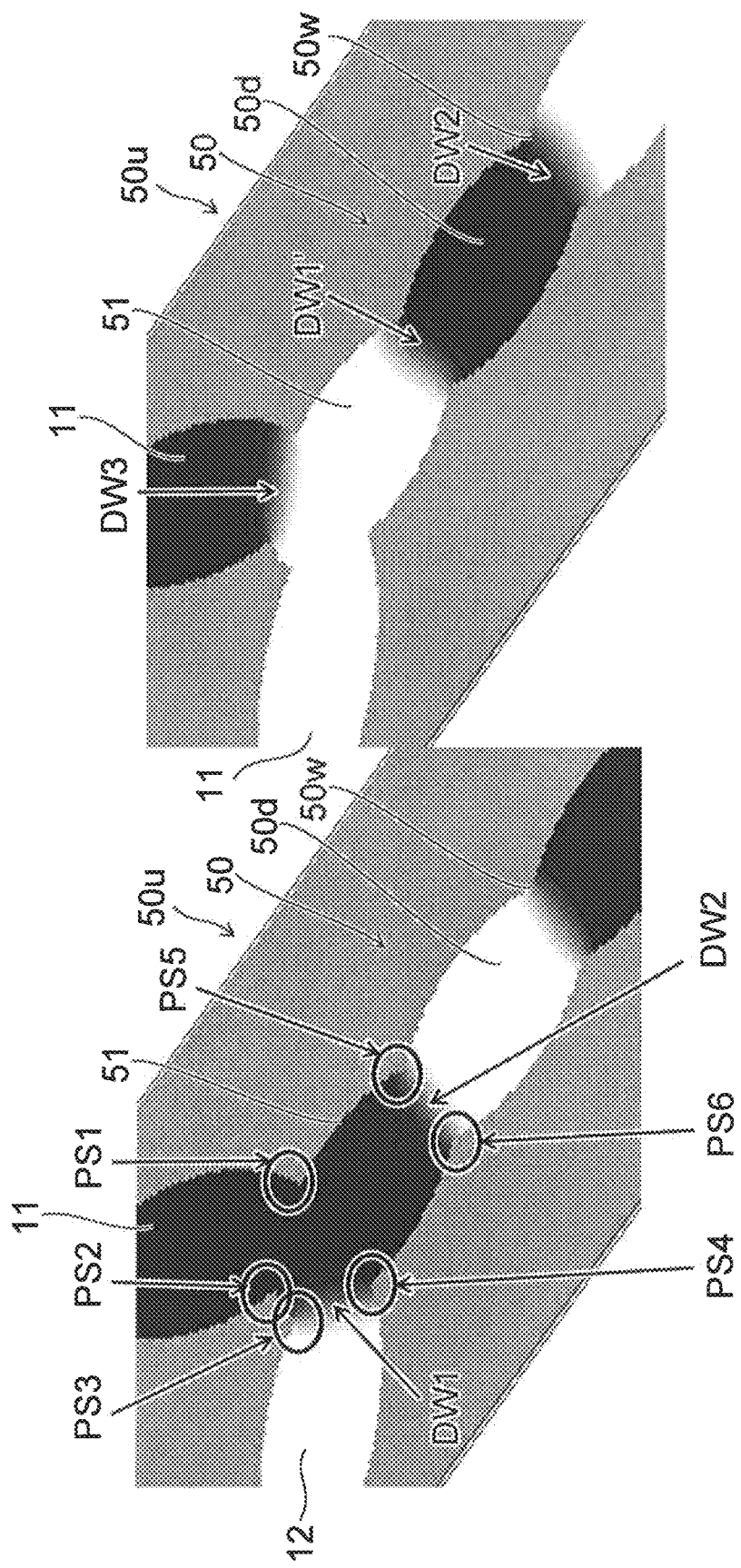
FIG. 25A and FIG. 25B are schematic views illustrating characteristics in the magnetic memory devices according to the embodiment.

FIG. 25A and FIG. 25B are schematic views illustrating characteristics in the magnetic memory devices according to the embodiment.

FIG. 25A is a figure which expands FIG. 24A. FIG. 25B is a figure which expands FIG. 24F.

As illustrated in FIG. 25A, first to sixth pinning ps1-ps6 are provided in the magnetic unit 50u. For example, the first pinning site ps1 and the second pinning site ps2 are provided at the boundary between the first magnetic part 11 and the first connection part 51, For example, the third pinning site psi and the fourth pinning site ps4 are provided at the boundary between the second magnetic part 12 and the first connection part 51. For example, the fifth pinning site ps5 and the sixth pinning site ps6 are provided at the boundary of the first connection part 51 and a magnetic domain 50d which is different from the first connection part 51. Magnetic wall DW1 is located at the boundary between the second magnetic part 12 and the first connection part 51. Magnetic wall DW1 corresponds to second connection part magnetic wall 50wb. Magnetic wall DW2 is located at the boundary between the first connection part 51 and a magnetic domain 50d different from the first connection part 51.

As already described with respect to FIG. 24B to FIG. 24E, the magnetic wall DW1 moves as the time advances and the length of magnetic wall DW1 increases in the first connection part 51.

As shown in FIG. 25B, the magnetic wall WD1 is divided into the magnetic wall DW3 and the magnetic wall DW1'. The magnetic wall DW3 is pinned by the first pinning site ps1 and the second pinning site ps2. The magnetic wall DW2 in FIG. 25B is moved from the position of the magnetic wall DW2 in FIG. 25A.

In the embodiment, the one magnetic wall (in this example, magnetic wall DW1) is pinned by two pinning site (in this example, the third pinning site ps3 and the fourth pinning site ps4). After the writing pulse is applied, the magnetic wall DW3 is located in the place of the first pinning site ps1 and the second pinning site ps2. And the magnetic wall WD1' is located in the place of the magnetic wall WD2 before the writing pulse is applied.

Various kinds of examples of magnetic unit 50u will be described hereafter.

FIG. 26A to FIG. 26J are schematic views illustrating the magnetic memory devices according to the embodiment.

As shown in FIG. 26A to FIG. 26J, the width of the boundary part between the first magnetic part 11 and the first magnetic wire 50 is narrower than the width of the first magnetic part 11, and narrower than the width of the magnetic domain 50d of the first magnetic wire 50. The width of the boundary part between the second magnetic part 12 and the first magnetic wire 50 is narrower than the width of the second magnetic part 12, and narrower than the width of the magnetic domain 50d of the first magnetic wire 50. For example, as described with respect to FIG. 3, periodic shape anisotropy is provided in the first magnetic wire 50. A geometric pinning site is provided in the magnetic unit 50u.

FIG. 27A to FIG. 27E are schematic views illustrating the magnetic memory devices according to the embodiment.

As shown in FIG. 27A to FIG. 27E, a material change portion 55 can be provided in the magnetic unit 50u. The material of the material change portion 55 differs from the material of portions other than material change partial 55. For example, the material contained in the material change portion 55 differs from composition of the material contained in the portions other than material change partial 55. The material change portion 55 can be formed by locally introducing elements (at least one of Ga, He, etc., for example). The pinning sites are formed by the material change portion 55.

Figures 28A, 28B, 28C:
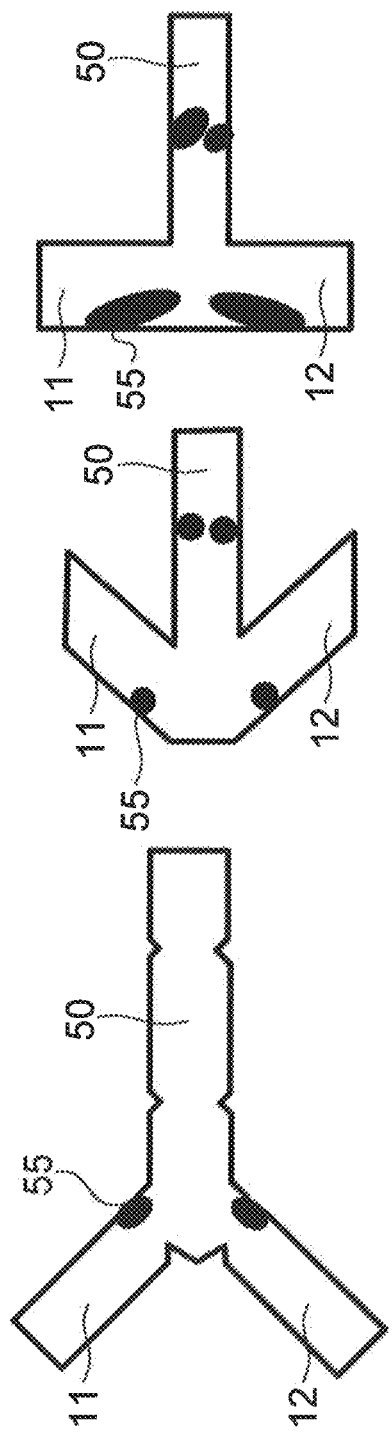
FIG. 28A to FIG. 28C are schematic views illustrating the magnetic memory devices according to the embodiment.

FIG. 28A to FIG. 28C are schematic views illustrating the magnetic memory devices according to the embodiment.

As shown in FIG. 28A to FIG. 28C, in these examples, the geometric pinning site and the pinning site based on the material change portion 55 are provided.

FIG. 29A to FIG. 29F are schematic views illustrating the magnetic memory devices according to the embodiment.

As shown in FIG. 29A to FIG. 29F, at least one of the first magnetic part 11, the second magnetic part 12, and the first magnetic wire 50 can be divided by at least one of geometric pinning sites and pinning sites based on the material change portion 55.

FIG. 30A to FIG. 30F are schematic views illustrating the magnetic memory devices according to the embodiment.

As shown in FIG. 29A to FIG. 29F, notches 50n are provided in a region between the first magnetic part 11 and the first magnetic wire and a region between the second magnetic part and the first magnetic wire. Notches 50 (depressions or recesses) includes pinning sites, for example. For example, the first pinning site ps1 and the second pinning site ps2 are provided in a region between the first magnetic part 11 and the first magnetic wire 50. The third pinning site ps3 and the fourth pinning site ps4 are provided in a region between the second magnetic part 12 and the first magnetic wire 50.

For example, the first pinning site psi and the second pinning site ps2 are provided around the first boundary part. The third pinning site ps3 and the fourth pinning site ps4 are provided around the second boundary part.

In the embodiment, the first magnetic wire 50 may have two-dimensional structure or may have three-dimensional structure. A pinning site may surround the first boundary part. Another pinning site may surround the second boundary site.

According to the embodiments, the magnetic memory device in which stable operation is possible, and its driving method can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the magnetic memory devices such as magnetic units, magnetic wires, magnetic parts, switch parts, switches, transistors, transmission gates, inverters, resistance, sources of current, sources of voltage, reading parts, word lines, bit lines and the like from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all magnetic memory devices and driving methods for the magnetic memory devices practicable by an appropriate design modification by one skilled in the art based on the magnetic memory devices and driving methods for the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device comprising:
a magnetic unit including:
a first magnetic wire including a plurality of magnetic domains and a magnetic wall provided between the magnetic domains, the first magnetic wire has one end and one other end,
a first magnetic part connected with the one end and having a first magnetization, and
a second magnetic part connected with the one end, the second magnetic part being apart from the first magnetic part and having a second magnetization, the second magnetization being opposite to the first magnetization;
a first switching part including
a first switch connected with the first magnetic part and configured to flow a first current between the first magnetic part and the first magnetic wire, and
a second switch connected with the second magnetic part and configured to flow a second current between the second magnetic part and the first magnetic wire; and
a reading part configured to read a magnetization of at least one of the magnetic domains.

2. The device according to claim 1, wherein
the first switching part includes
a first transistor serving as the first switch, the first transistor including
a first gate,
a first source/drain region connected with the first magnetic part, and
a second source/drain region connected with a source of current,
a second transistor served as the second switch, the second transistor including
a second gate,
a third source/drain region connected with the second magnetic part, and
a fourth source/drain region connected with the source of current, a first inverter including
  a first inverter input connected with the first gate, and
  a first inverter output connected with the second gate,
a second inverter including
  a second inverter input connected with the first output and the second gate, and
  a second inverter output connected with the first input and the first gate.

3. The device according to claim 1, wherein
the first switching part includes
a first transmission gate serving as the first switch, the first transmission gate including
  a first input part connected with a source of current,
  a first output part connected with the first magnetic part,
  a first gate configured to be supplied with a first data signal, and
  a second gate configured to be supplied with a second data signal inverse to the first data signal, and
a second transmission gate serving as the second switch, the second transmission gate including
  a second input part connected with the source of current,
  a second output part connected with the second magnetic part, and
  a third gate configured to be supplied with the second data signal, and
  a fourth gate configured to be supplied with the first data signal.

4. The device according to claim 1, wherein
the first switching part includes
a first transistor of a p-type MOSFET serving as the first switch, the first transistor including
  a first gate configured to be supplied with a first data signal,
  a first source/drain region connected with the first magnetic part, and
  a second source/drain region connected with a source of current,
a second transistor of an n-type MOSFET serving as the second switch, the second transistor includes
  a second gate configured to be supplied with the first data signal,
  a third source/drain region connected with the second magnetic part, and
  a fourth source/drain region connected with the source of current.

5. The device according to claim 1, wherein
the first switching part includes
a first transistor of an n-type MOSFET serving as the first switch, the first transistor including,
  a first gate connected with a first node,
  a first source/drain region connected with the first magnetic part, and
  a second source/drain region connected with a second node;
a second transistor of the n-type MOSFET serving as the second switch, the second transistor including
  a second gate connected with the second node,
  a third source/drain region connected with the second magnetic part, and
  a fourth source/drain region connected with the first node,
a third transistor of a p-type MOSFET including
  a third gate connected with the first node,
  a fifth source/drain region connected with the second node, and
  a sixth source/drain region connected with a terminal provided with a predetermined voltage,
a fourth transistor of the p-type MOSFET including
  a fourth gate connected with the second node,
  a seventh source/drain region connected with the first node, and
  an eighth source/drain region connected with the terminal,
a fifth transistor of the n-type MOSFET including,
  a fifth gate connected with a word line,
  a ninth source/drain region connected with the second node, and
  a tenth source/drain region configured to be supplied with a first data signal;
a sixth transistor of the n-type MOSFET including
  a sixth gate connected with the word line,
  an eleventh source/drain region connected with the first node, and
  a twelfth source/drain region configured to be supplied with a second data signal inverse to the first data signal.

6. The device according to claim 5, wherein
the first switch part includes a reading transistor,
the reading transistor includes
  a reading gate configured to be supplied with a read signal,
  a first reading source/drain region connected with the first node, and
  a second reading source/drain region connected with the second node, and
the reading part includes
  a sensing transistor, and
  a sensing device, a resistance of the sensing device configured to be changed in accordance with a change of the magnetization of at least one of the magnetic wires,
the sensing transistor including
  a sensing gate configured to be supplied with the read signal,
  a first sensing source/drain region electrically connected with the sensing device, and
  a second sensing source/drain region electrically connected with the terminal.

7. The device according to claim 6, further comprising a flip flop circuit, the flip flop circuit including
  a first flip flop terminal connected with the second sensing source/drain region,
  a second flip flop terminal connected with a first line supplied with the first data signal, and
  a third flip flop terminal connected with a second line supplied with the second data signal.

8. The device according to claim 1, further comprising a second switching part,
the magnetic unit further including
  a third magnetic part connected with the one other end and having a third magnetization, and
  a fourth magnetic part connected with the one other end, the fourth magnetic part being apart from the third magnetic part and having a fourth magnetization, and
the second switching part including
  a third switch connected with the third magnetic part and configured to flow a third current between the third magnetic part and the first magnetic wire, and
  a fourth switch connected with the fourth magnetic part and configured to flow a fourth current between the fourth magnetic part and the first magnetic wire.

9. The device according to claim 1, wherein
a direction connecting the first magnetic part and the second magnetic part crosses an extending direction of the first magnetic wire.

10. The device according to claim 1, wherein
at least a part of the one end is disposed between a part of the first magnetic part and a part of the second magnetic part.

11. The device according to claim 1, wherein
the first magnetic part includes a first magnetic layer having a perpendicular anisotropy,
the second magnetic part includes a second magnetic layer having a perpendicular anisotropy, and
the magnetic wire includes a third magnetic layer having a perpendicular anisotropy.

12. The device according to claim 11, wherein
at least one of the first magnetic part, the second magnetic part and the first magnetic wire includes
at least one selected from the group consisting of cobalt, iron, and nickel, and
at least one selected from the group consisting of chromium, zirconium, copper, ruthenium, terbium, silicon, germanium, gallium, magnesium, manganese, bismuth, boron, and antimony.

13. The device according to claim 11, wherein
at least one of the first magnetic part, the second magnetic part and the magnetic wire includes at least one of a non-magnetic conductive layer and an insulating layer,
the non-magnetic conductive layer includes at least one selected from the group consisting of platinum, tantalum, tungsten, zirconium, bismuth, terbium, palladium, copper, silver, iridium, gold, aluminum, and ruthenium, and
the insulating layer includes at least one of an oxide including at least one selected from the group consisting of aluminum, titanium, tantalum, cobalt, nickel, silicon, magnesium, and iron, a nitride including at least one selected from the group consisting of aluminum, titanium, tantalum, cobalt, nickel, silicon, magnesium, and iron and a fluoride including at least one selected from the group consisting of aluminum, titanium, tantalum, cobalt, nickel, silicon, magnesium, and iron.

14. The device according to claim 1, wherein
a first boundary part provided between the first magnetic part and the first magnetic wire is narrower than the first magnetic part and narrower than the magnetic domain of the first magnetic wire, and
a second boundary part provided between the second magnetic part and the first magnetic wire is narrower than the second magnetic part and narrower than the magnetic domain of the first magnetic wire.

15. The device according to claim 14, wherein the magnetic unit includes
a first magnetic wall provided at the first boundary part or near the first boundary part, and
a second magnetic wall provided at the second boundary part or near the second boundary part.

16. The device according to claim 1, wherein
a first pinning potential is provided in a first boundary part provided between the first magnetic part and the first magnetic wire, and
a second pinning potential is provided in a second boundary part provided between the second magnetic part and the first magnetic wire.

17. The device according to claim 16, wherein the magnetic unit includes
a pinning site provided at the first boundary part or near the first boundary part, and
a pinning site provided at the second boundary part or near the second boundary part.

18. The device according to claim 16, wherein the magnetic unit includes
a first pinning site and a second pinning site provided around the first boundary part, and
a third pinning site and a fourth pinning provided around the second boundary part.

19. The device according to claim 1, wherein at least one of a first region, a second region, and the magnetic domains of the first magnetic wire includes a material different from a material of the magnetic domains of the first magnetic wire,
the first region is provided between the one end and the first magnetic part,
the second region is provided between the one end and the second magnetic part, and
the third region provided in at least one of the magnetic walls of the magnetic wire.

20. The device according to claim 1, wherein the first magnetic wire has a periodic pinning potential provided along an extending direction of the first magnetic wire.

21. The device according to claim 1,
the magnetic unit further includes a second magnetic wire, and one end of the second magnetic wire is connected with a part of the first magnetic wire.

22. A driving method of a magnetic memory device, the magnetic memory device including
a magnetic unit including
a first magnetic wire including a plurality of magnetic domains and a magnetic wall provided between the magnetic domains, the first magnetic wire having one end and one other end,
a first magnetic part connected with the one end and having a first magnetization,
a second magnetic part connected with the one end, the second magnetic part being apart from the first magnetic part and having a second magnetization, the second magnetization being opposite to the first magnetization,
a third magnetic part connected with the one other end and having a third magnetization, and
a fourth magnetic part connected with the one other end, the fourth magnetic part being apart from the third magnetic part and having a fourth magnetization, the fourth magnetization being opposite to the third magnetization,
a first switching part including
a first switch connected with the first magnetic part and configured to flow a first current between the first magnetic part and the first magnetic wire, and
a second switch connected with the second magnetic part and configured to flow a second current between the second magnetic part and the first magnetic wire,
a second switching part including
a third switch connected with the third magnetic part and configured to flow a third current between the third magnetic part and the first magnetic wire, and
a fourth switch connected with the fourth magnetic part and configured to flow a fourth current between the fourth magnetic part and the first magnetic wire,
the method comprising:
setting a direction of the first current opposite to a direction of the third current; and
setting a direction of the second current opposite to a direction of the fourth current.

* * * * *